US008548334B2

(12) United States Patent
Mazed

(10) Patent No.: US 8,548,334 B2
(45) Date of Patent: Oct. 1, 2013

(54) DYNAMIC INTELLIGENT BIDIRECTIONAL OPTICAL ACCESS COMMUNICATION SYSTEM WITH OBJECT/INTELLIGENT APPLIANCE-TO-OBJECT/INTELLIGENT APPLIANCE INTERACTION

(76) Inventor: Mohammad Mazed, Yorba Linda, CA (US)

( * ) Notice: Subject to any disclaimer, the term of this patent is extended or adjusted under 35 U.S.C. 154(b) by 0 days.

(21) Appl. No.: 12/931,384

(22) Filed: Jan. 31, 2011

(65) Prior Publication Data

US 2011/0158653 A1 Jun. 30, 2011

Related U.S. Application Data

(63) Continuation-in-part of application No. 12/238,286, filed on Sep. 25, 2008, which is a continuation-in-part of application No. 11/952,001, filed on Dec. 6, 2007, now Pat. No. 8,073,331.

(60) Provisional application No. 61/404,504, filed on Oct. 5, 2010, provisional application No. 60/970,487, filed on Sep. 6, 2007, provisional application No. 60/883,727, filed on Jan. 5, 2007, provisional application No. 60/868,838, filed on Dec. 6, 2006.

(51) Int. Cl.
*H04B 10/00* (2013.01)
*H04J 14/02* (2006.01)

(52) U.S. Cl.
USPC ............... 398/140; 398/72; 398/79; 398/156; 398/170

(58) Field of Classification Search
USPC .............................. 398/140, 72, 79
See application file for complete search history.

(56) References Cited

U.S. PATENT DOCUMENTS

| 2004/0141759 | A1* | 7/2004 | Stiscia et al. ................ 398/168 |
| 2005/0184875 | A1* | 8/2005 | Schmandt et al. .......... 340/573.1 |
| 2006/0093359 | A1* | 5/2006 | Lee et al. ....................... 398/70 |
| 2006/0115271 | A1* | 6/2006 | Hwang et al. .................. 398/72 |
| 2006/0222364 | A1* | 10/2006 | Chung et al. .................. 398/72 |
| 2007/0104225 | A1* | 5/2007 | Mizuochi et al. ............ 370/476 |
| 2007/0133923 | A1* | 6/2007 | Park et al. ..................... 385/14 |
| 2007/0140704 | A1* | 6/2007 | Mauro et al. ................ 398/188 |
| 2007/0154217 | A1* | 7/2007 | Kim et al. ...................... 398/72 |
| 2007/0183779 | A1* | 8/2007 | Bouda et al. ................... 398/72 |
| 2007/0206948 | A1* | 9/2007 | Lee et al. ....................... 398/71 |
| 2008/0037990 | A1* | 2/2008 | Effenberger ................... 398/67 |
| 2008/0120668 | A1* | 5/2008 | Yau ............................. 725/110 |

* cited by examiner

*Primary Examiner* — Kenneth N Vanderpuye
*Assistant Examiner* — Oommen Jacob
(74) *Attorney, Agent, or Firm* — Leech Tishman Fuscaldo & Lampl, LLP; Ivan Posey, Esq.

(57) ABSTRACT

Reduced Rayleigh backscattering effect enables a longer-reach optical access communication network-thus it eliminates significant costs. Furthermore, a wavelength to an intelligent subscriber subsystem can be dynamically varied for bandwidth on-Demand and service on-Demand. A software module renders intelligence (and context awareness) to a subscriber subsystem and an appliance. An object can sense/measure/collect/aggregate/compare/map and connect/couple/interact (via one or more or all electrical/optical/radio/electro-magnetic/sensor/bio-sensor communication network(s) within and/or to and/or from an object) with another object, an intelligent subscriber subsystem and an intelligent appliance utilizing an Internet protocol version 6 (IPv6) and its subsequent versions.

A construction of a near-field communication (NFC) enabled intelligent micro-subsystem and/or intelligent appliance with key applications (e.g., an intelligent, location based and personalized social network and an intelligent, location based and personalized direct and peer-to-peer marketing) are also described.

25 Claims, 13 Drawing Sheets

DYNAMIC INTELLIGENT BIDIRECTIONAL OPTICAL ACCESS COMMUNICATION SYSTEM WITH OBJECT/INTELLIGENT APPLIANCE-TO-OBJECT/INTELLIGENT APPLIANCE INTERACTION

CROSS REFERENCE TO RELATED APPLICATIONS

The present application is a continuation-in-part (CIP) of now pending U.S. non-provisional patent application entitled "Portable Internet Appliance", Ser. No. 12/238,286 filed on Sep. 25, 2008, and is a continuation-in-part (CIP) of U.S. non-provisional patent application entitled "Dynamic Intelligent Bidirectional Optical and Wireless Access Communication System", Ser. No. 11/952,001 filed on Dec. 6, 2007, which issued as U.S. Pat. No. 8,073,331, which claims the benefit of priority to U.S. provisional patent application entitled "Dynamic Intelligent Bidirectional Optical Access Communication System With Object/Intelligent Appliance-To-Object/Intelligent Appliance Interaction", Ser. No. 61/404,504 filed on Oct. 5, 2010, U.S. provisional patent application entitled "Intelligent Internet Device", Ser. No. 60/970,487 filed on Sep. 6, 2007, U.S. provisional patent application entitled "Wavelength Shifted Dynamic Bidirectional System", Ser. No. 60/883,727 filed on Jan. 6, 2007, and U.S. provisional patent application entitled "Wavelength Shifted Dynamic Bidirectional System", Ser. No. 60/868,838 filed on Dec. 6, 2006, which are all incorporated by reference as if reproduced herein in their entirety.

FIELD OF THE INVENTION

Bandwidth demand and total deployment cost (capital cost and operational cost) of an advanced optical access communication system are increasing, while a return on investment is decreasing. This has created a significant business dilemma.

More than ever before, we have become more mobile and global. An intelligent pervasive and always-on Internet access via convergence of all (e.g., an electrical/optical/radio/electro-magnetic/sensor/bio-sensor) communication networks can provide connectivity at anytime, from anywhere, to anything is desired.

The present invention is related to a dynamic bidirectional optical access communication system with an intelligent subscriber subsystem can connect/couple/interact (via one or more or all electrical/optical/radio/electro-magnetic/sensor/bio-sensor communication network(s) within and/or to and/or from an intelligent subscriber subsystems) with another object and an intelligent appliance utilizing an Internet protocol version 6 (IPv6) and its subsequent versions.

An intelligent subscriber system and/or an object and/or an intelligent appliance comprises one/more of the following modules (wherein a module is defined as a functional integration of critical electrical/optical/radio/sensor components, circuits and algorithms/stacks-needed to achieve a desired function/property of a module): a laser, a photodiode, a modulator, a demodulator, a phase-to-intensity converter, an amplifier, a wavelength combiner/decombiner, an optical power combiner/decombiner, a cyclic arrayed waveguide router, a micro-electrical-mechanical-systems (MEMS) space switch, an optical switch, an optical circulator, an optical filter, an optical intensity attenuator, a processor, a memory, a display, a microphone, a camera, a sensor, a biological sensor, a radio, a near-field-communication, a scanner, a power source, (b) an embedded and/or a cloud based operating system software module (wherein a software module is defined as a functional integration of critical algorithms/stacks-needed to achieve a desired function/property of a software module) and/or (c) an embedded and/or a cloud based intelligence rendering software module.

Furthermore, an object can sense/measure/collect/aggregate/compare/map and connect/couple/interact (via one or more or all electrical/optical/radio/electro-magnetic/sensor/bio-sensor communication network(s) within and/or to and/or from an object) with another object, an intelligent subscriber subsystem and an intelligent appliance utilizing an Internet protocol version 6 (IPv6) and its subsequent versions.

SUMMARY OF THE INVENTION

A dynamic intelligent bidirectional optical access communication system utilizes two critical optical modules: a phase modulator and an intensity modulator at an intelligent subscriber subsystem. Together, these two critical optical modules can reduce the Rayleigh backscattering effect on the propagation of optical signals.

Reduced Rayleigh backscattering effect can enable a longer-reach optical access communication network (longer-reach than that of a currently deployed optical access communication network) between an intelligent subscriber subsystem and a super node (e.g., many neighbouring nodes collapsed into a preferred super node). Such a longer-reach optical access communication network eliminates significant costs related to a vast array of middle equipment (e.g., a router/switch) which otherwise would be needed between a standard node (without a super node configuration) and a large number of remote nodes, according to a currently deployed optical access communication network.

In one key embodiment of the present invention, a bidirectional optical access communication system can be configured to be capable of a longer-reach optical access communication network.

In another key embodiment of the present invention, a bidirectional optical access communication system can be configured to be capable of dynamically providing wavelength on-Demand and/or bandwidth on-Demand and/or service on-Demand.

In another key embodiment of the present invention, a construction of a wavelength-tunable laser component/module is described.

In another key embodiment of the present invention, an optical signal can be routed to an intended destination securely by extracting an intended destination from a destination marker optical signal.

In another key embodiment of the present invention, a construction and applications of an object is described.

In another key embodiment of the present invention, an object can sense/measure/collect/aggregate/compare/map and connect/couple/interact (via one or more or all electrical/optical/radio/electro-magnetic/sensor/bio-sensor communication network(s) within and/or to and/or from an object) with another object, an intelligent subscriber subsystem and an intelligent appliance utilizing an Internet protocol version 6 (IPv6) and its subsequent versions.

In another key embodiment of the present invention, an intelligence rendering software module allows a subscriber subsystem to adapt/learn/relearn a user's interests/preferences/patterns and thereby rendering an intelligence to a subscriber subsystem.

In another key embodiment of the present invention, an intelligence rendering software module allows an appliance to adapt/learn/relearn a user's interests/preferences/patterns and thereby rendering an intelligence to an appliance.

In another key embodiment of the present invention, a construction of a near-field communication (NFC) enabled micro-subsystem/intelligent appliance is described.

In another key embodiment of the present invention, a portfolio of key applications (e.g., an intelligent, location based and personalized social network and direct/peer-to-peer marketing) are also described.

The present invention can be better understood in the description below with accompanying drawings.

DETAILED DESCRIPTION OF THE PREFERRED EMBODIMENTS

Figure 1:
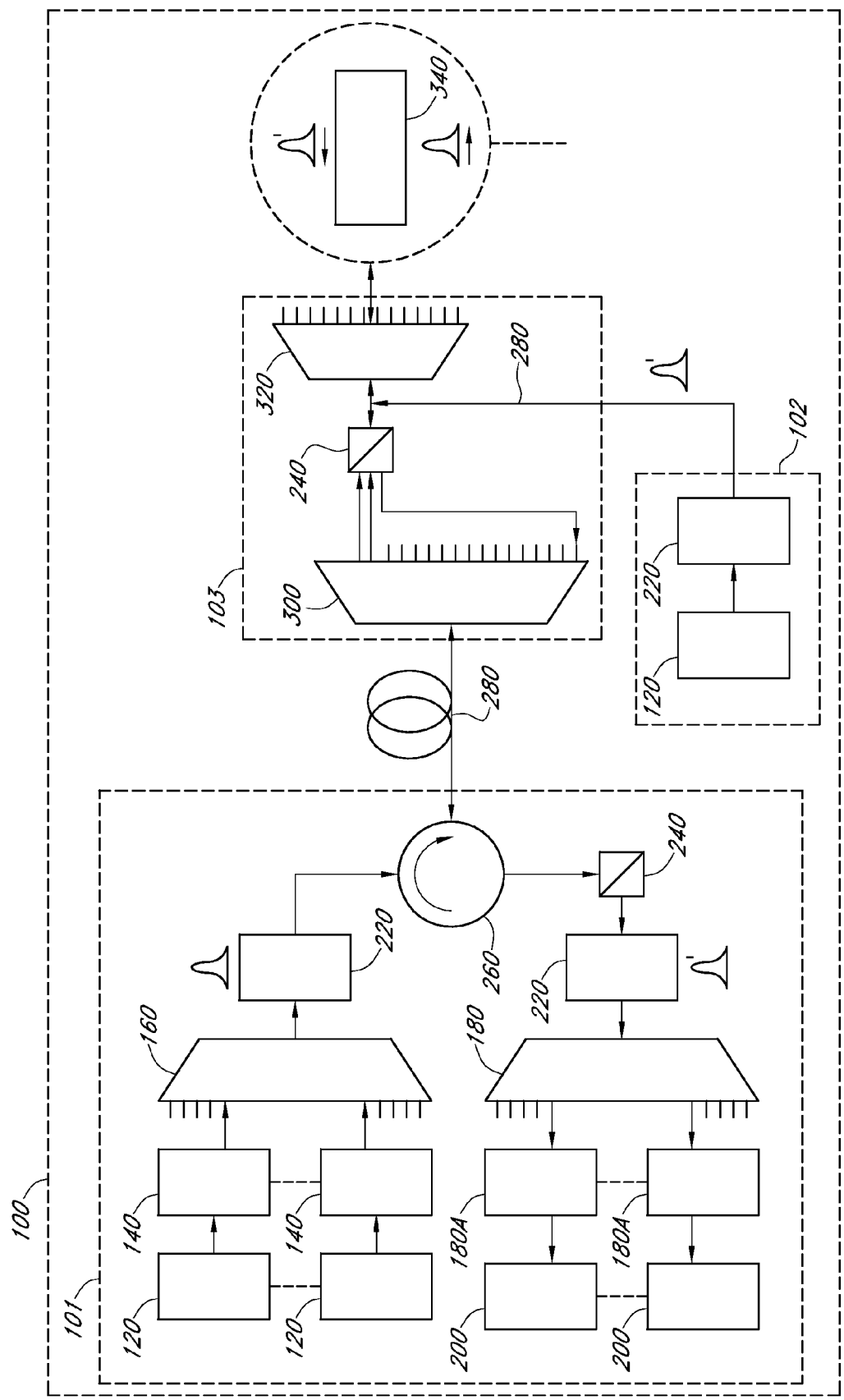
FIG. 1 illustrates a block diagram construction (configuration) of a bidirectional optical access communication network 100, according to one embodiment of the present invention.

FIG. 1 illustrates a block diagram construction (configuration) of a bidirectional optical access communication network 100, which includes a super node 101, many distant local nodes 102 and many distant remote nodes 103. Distance between a super node 101 and a remote node 103 is greater than that between a super node 101 and a local node 102. However, many local nodes 102 can collapse/reside within a super node 101 to enable a bidirectional optical access communication network 100 without a road-side electrical power requirement at a local node 102.

A bidirectional optical access communication network 100 is connected/coupled/interacted with a super node 101, many local nodes 102, many remote nodes 103 and a large number of intelligent subscriber subsystems 340 (located at homes/businesses) over a dispersion-compensated single-mode optical fiber. At a super node 101, a number of laser modules (high power fast wavelength switching-wavelength tunable semiconductor laser modules are preferred) 120 provide first set of downstream wavelengths, where each downstream wavelength is modulated at 10 Gb/s or higher Gb/s, by a corresponding intensity modulator module (an electro-absorption/Mach-Zehnder intensity modulator module is preferred) 140 to provide optical signals. These modulated downstream wavelengths (embedded with the optical signals) are combined by a wavelength combiner module 160 and amplified by an erbium-doped fiber amplifier (EDFA) module 220. These amplified downstream wavelengths are passed through a 3-port circulator module 260 and transmitted over a dispersion-compensated single-mode optical fiber (with a distributed Raman amplifier is preferred) 280 to a remote node 103. A distributed Raman amplifier can provide a distributed amplification of an optical signal over a dispersion-compensated single-mode optical fiber by a nonlinear coupling/interaction between an optical signal and an optical pump signal and thereby effectively increasing the reach of an optical access communication network than that of a currently deployed optical access communication network. At a remote node 103, modulated downstream wavelengths from a super node 101, are decombined by an integrated wavelength combiner/decombiner module 300, filtered by a bandpass optical filter module (a wavelength switching-wavelength tunable bandpass optical filter module is preferred) 240, are power split by an integrated optical power combiner/decombiner module 320 and are transmitted to a number of intelligent subscriber subsystems 340. However, all the optical modules at a remote node 103 must be temperature-insensitive to operate within a wide temperature range at a remote node 103, as there may not be an electrical power at a remote node 103. The downstream wavelength from a super node 101 to a number of intelligent subscriber subsystems 340 can be transmitted and correspondingly received by photodiode modules 200 at intelligent subscriber subsystems 340, utilizing a time division multiplexed statistical bandwidth allocation and/or a broadcasting method.

A local node 102 includes a laser module 120, which is connected/coupled/interacted with an erbium-doped fiber amplifier (EDFA) module 220 to provide an upstream wavelength from intelligent subscriber subsystems 340, which is offset in wavelength with respect to the first set of downstream wavelengths generated at a super node 101. The upstream wavelength power splits through an integrated optical power combiner/decombiner module 320 at a remote node 103 and is transmitted to a number of intelligent subscriber subsystems 340 for optical processing within an optical processing micro-subsystem 360. An optically processed upstream wavelength (embedded with the optical signals) within an optical processing micro-subsystem 360 (within an intelligent subscriber subsystem 340) is looped/returned back through an integrated optical power combiner/decombiner module 320, a bandpass optical filter module 240 and an integrated wavelength combiner/decombiner module 300 at a remote node 103. An optically processed upstream wavelength is transmitted over a dispersion-compensated single-mode optical fiber 280 and passed through a 3-port circulator module 260 at a super node 101. A 3-port circulator module 260 provides an upstream wavelength from a number of intelligent subscriber subsystems 340 to a bandpass optical filter 240, an erbium-doped fiber amplifier (EDFA) module 220, a wavelength decombiner module 180, a number of external fiber-optic interferometer module 180A (to convert a phase modulation signal into an intensity modulation signal) and a photodiode module 200 at a super node 101, wherein each photodiode module 200 is detecting a distinct upstream wavelength. Furthermore, a photodiode module 200 comprises one or more of the following optical/electronic components: a 10 Gb/s or higher Gb/s linear photodiode chip, a 10 Gb/s or higher Gb/s mesa-type/waveguide-type avalanche photodiode chip (APD), a 10 Gb/s or higher Gb/s burst-mode trans-impedance amplifier, a 10 Gb/s or higher Gb/s clock and data recovery (CDR), a bandpass optical filter 240 and a semiconductor optical amplifier 380 (if a semiconductor optical amplifier 380 is needed for an optical gain in conjunction with a 10 Gb/s or higher Gb/s linear photodiode chip). The upstream wavelength from a number of intelligent subscriber subsystems 340 to a super node can be transmitted and correspondingly received by photodiode modules 200 at a super node 101, utilizing a time division multiplexed statistical bandwidth allocation and/or a broadcasting method.

Figure 2:
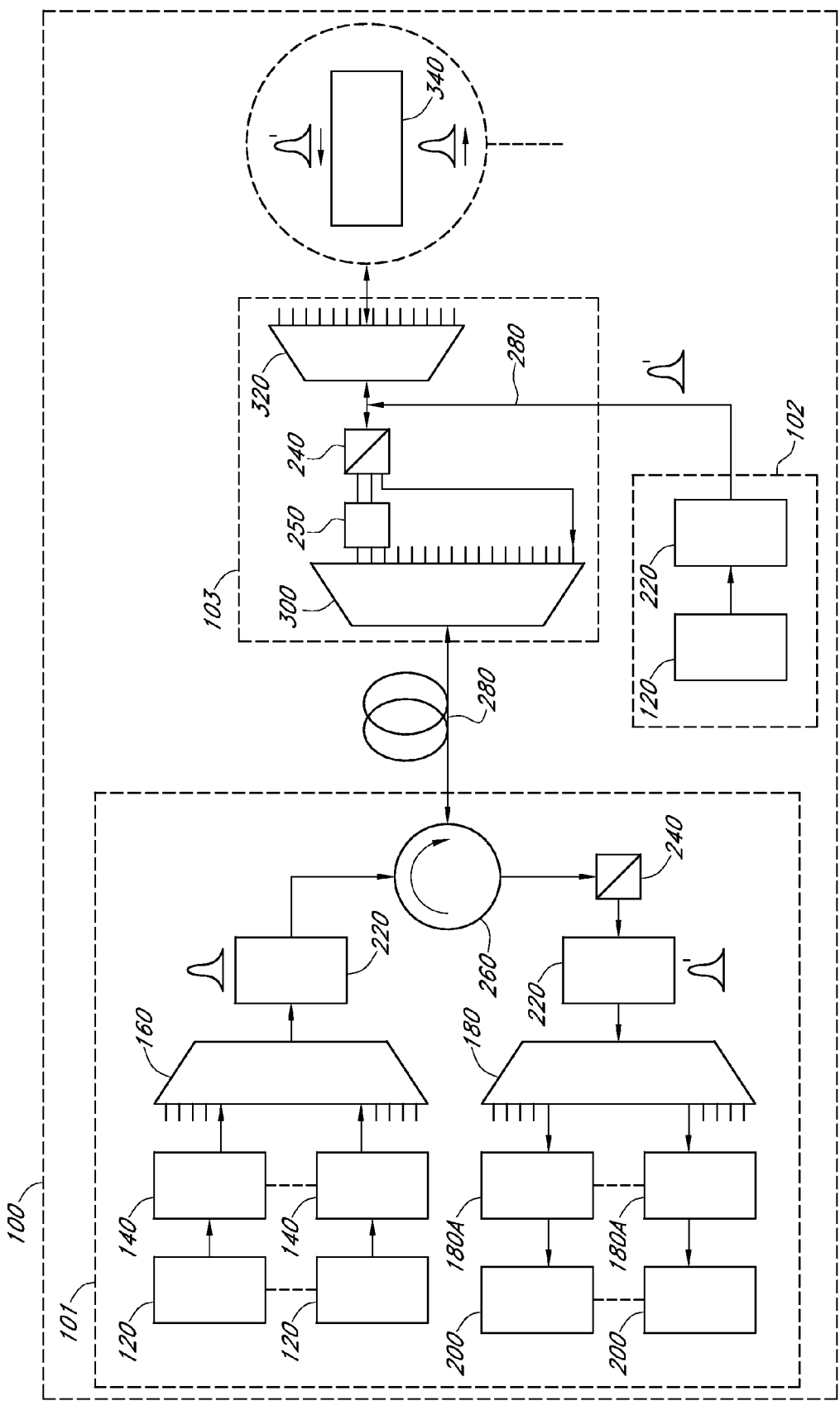
FIG. 2 illustrates a block diagram construction (configuration) of a dynamic bidirectional optical access communication network 100, according to another embodiment of the present invention.

FIG. 2 illustrates a block diagram construction (configuration) of a dynamic bidirectional optical access communication network 100, where a wavelength to an intelligent subscriber subsystem 340 can be dynamically varied on-Demand by utilizing an M:M cyclic wavelength arrayed waveguide grating router module (a fast wavelength switching-wavelength tunable programmable M:M cyclic wavelength arrayed waveguide grating router module is preferred) 250 at a remote node 103. All possible switched output downstream wavelengths are arranged at the M outputs of an M:M cyclic wavelength arrayed waveguide grating router module 250 because of its free spectral range periodic property of an M:M cyclic wavelength arrayed waveguide grating router module. This construction (configuration) offers a flexibility of dynamically routing/delivering one or more downstream wavelength with different modulation rates (e.g., 10 Gb/s or higher Gb/s) provided by a corresponding intensity modulator module 140, to an intelligent subscriber subsystem 340 for wavelength on-Demand, bandwidth on-Demand and service on-Demand, significantly increasing a return on investment. Thus each dynamically routed wavelength with a specific modulation rate can provide a distinct bandwidth-specific service on-Demand (e.g., an ultra-high definition movie on-Demand) to an intelligent subscriber subsystem 340.

A method of providing bandwidth-specific service on-Demand can be realized by comprising at least the steps of (a) a user requesting a specific service (e.g., an ultra-high definition movie on-Demand) at an intelligent subscriber subsystem 340, (b) delivering the specific service over a wavelength by a laser module 120 at a super node 101, (c) modulating the wavelength at a required modulation rate (e.g., 10 Gb/s or higher Gb/s) by an intensity modulator module 140 at a super node 101 and (d) dynamically routing the said wavelength (embedded with a user requested specific service) by an M:M cyclic wavelength arrayed waveguide grating router module 250 to a remote node 103 and to an intelligent subscriber subsystem 340.

Thus a rapid wavelength routing (in space, wavelength and time) by an M:M cyclic wavelength arrayed waveguide grating router module 250 can be constructed as an optical packet/interconnect router between many printed circuit boards/integrated circuits/microprocessors.

Furthermore, outputs of an M:M cyclic wavelength arrayed waveguide grating router module 250 at a remote node 103 can be connected/coupled/interacted with inputs of a large scale N:N (e.g., a 1000:1000) micro-electrical-mechanical-systems (MEMS) space switch module at a remote node 103 to provide a much greater flexibility of wavelength routing.

An input-output echelle grating module and a negative-index photonic crystal super-prism module can be utilized as alternatives to a wavelength combiner module 160, a wavelength decombiner module 180 and an integrated wavelength combiner/decombiner module 300. A multi-mode interference (MMI) module and Y-combiner module can be utilized as alternatives to an integrated optical power combiner/decombiner module 320 and optical power combiner module 320 A.

Figure 3:
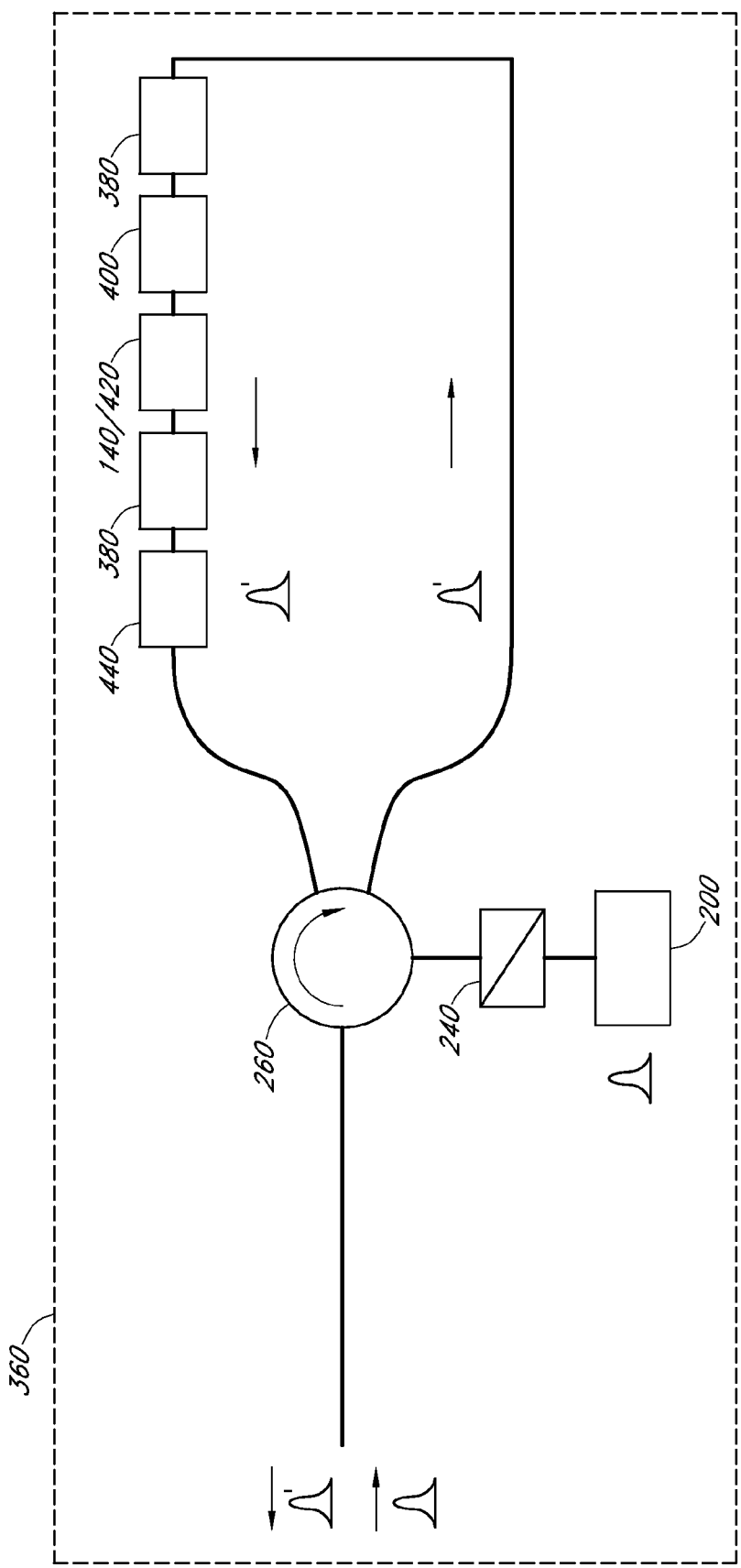
FIG. 3 illustrates a block diagram construction (configuration) of an optical processing micro-subsystem 360 (within an intelligent subscriber subsystem), according to another embodiment of the present invention.

FIG. 3 illustrates a block diagram construction (configuration) of an optical processing micro-subsystem 360, wherein downstream wavelength is passed through a 3-port circulator 260, a bandpass optical filter module 240 and a photodiode module 200. A wavelength from a laser module 120 at local node 102 is passed through a 3-port circulator module 260 within an optical processing micro-subsystem 360 and this wavelength is amplified by a semiconductor optical amplifier module 380, modulated in phase by a phase modulator module 400, modulated at a bit-rate (e.g., 10 Gb/s or higher Gb/s, but a variable modulation bit-rate is preferred) in intensity by an intensity modulator module 420, amplified by a semiconductor optical amplifier module 380, transmitted through a variable optical intensity attenuator module 440 (if needed) and looped/returned back to create an upstream wavelength (embedded with an optical signal) and transmitted to a super node 101.

Furthermore, a generic intensity modulator module 140 can replace an electro-absorption intensity modulator module 420, which is designed for an integration with a semiconductor optical amplifier module 380, a phase modulator module 400 and a variable optical intensity attenuator module 440 on a monolithic photonic integrated circuit (PIC) and/or an active-passive hybrid planar lightwave circuit (PLC) technology.

Numerous permutations (e.g., modulating a CW optical signal from a laser module 120 at a local node 102 by an intensity modulator 140/420 and then by a phase modulator 400) of all optical modules within an optical processing micro-subsystem 360 are possible to create an optimum quality of an upstream wavelength for an intended reach. Use of a phase modulator module 400 and an intensity modulator module 420 together can reduce the Rayleigh backscattering effect on the propagation of optical signals, enabling a longer-reach optical access communication network between a super node 101 and a remote node 103, thus eliminating a vast array of middle equipment such as routers and switches, which would otherwise be needed between a standard node (without a super node configuration) and a large number of remote nodes 103, according to a currently deployed optical access communication network.

According to another embodiment of the present invention, an upstream second set of wavelengths (which are offset in wavelengths with respect to first set of wavelengths transmitted from a super node 101), can be internally generated by a wavelength-tunable laser module within an intelligent subscriber subsystem 340, without a need of an external wavelength generation by a laser module 120 at a local node 102. Generation of an upstream wavelength (fast switching-widely tunable laser module is preferred) within an intelligent subscriber subsystem 340 simplifies a construction of a dynamic bidirectional optical access communication network 100.

According to another embodiment of the present invention, a single-mode/mode-hopp free wavelength tunable (about 32 nm) laser module can be constructed by utilizing an ultra-low anti-reflection coated (both facets) semiconductor optical amplifier (a photonic crystal/aka quantum dot semiconductor optical amplifier is preferred) and a triple-ring resonator waveguide on a planar lightwave circuit (PLC) platform. The front facet of a triple-ring resonator waveguide has an ultra-low anti-reflection coating, while the back facet of that has a high-reflection coating. The anti-reflection coated back facet of a semiconductor optical amplifier and the anti-reflection coated front facet of a triple-ring resonator waveguide are intimately attached ("butt-coupled") to each other. The phases of a triple-ring resonator waveguide can be controlled by a metal strip heater along a straight segment of a triple-ring resonator waveguide. Furthermore, a semiconductor optical amplifier can be monolithically integrated with an electro-absorption/Mach Zehnder intensity modulator.

Figure 3A:
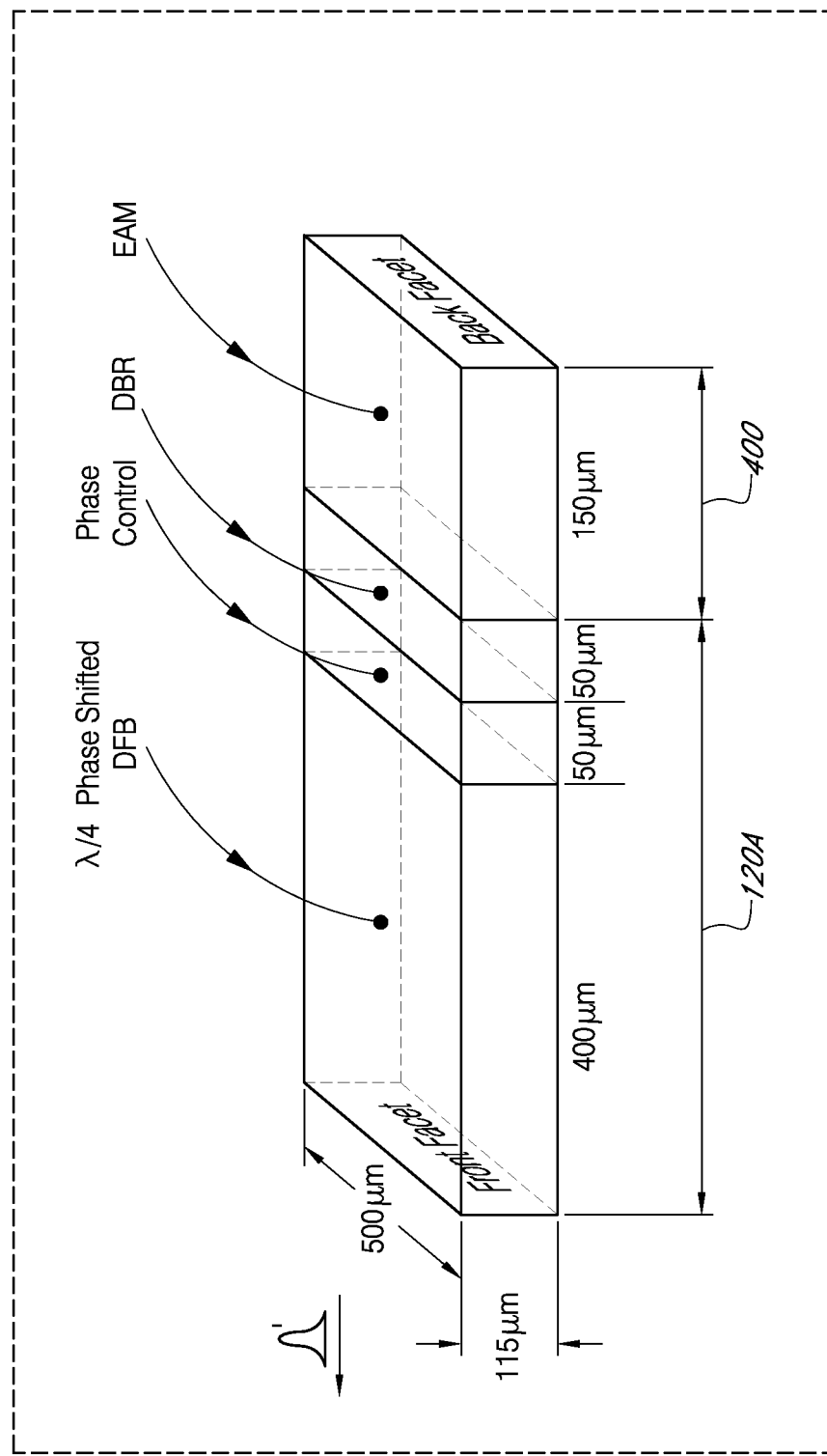
FIG. 3A illustrates a block diagram construction (configuration) of a wavelength tunable (narrowly) laser component, according to another embodiment of the present invention.

FIG. 3A illustrates a block diagram construction (configuration) of a single-mode/mode-hopp free wavelength tunable (narrow) laser component, comprising an electro-absorption modulator (EAM) segment 400 (about 150 micron long), which can be integrated ("butt-coupled") with the back facet of a λ/4 phase shifted DR laser (λ/4 phase shifted distributed feed back (DFB) section (about 400 micron long)+phase control section (without any gratings/about 50 micron long)+distributed Bragg reflector (DBR) section (about 50 micron long)) 120A. Laser multi-quantum-well (MQW) layers can be stacked on top of electro-absorption intensity modulator (EAM) multi-quantum-well (MQW) layers. An electro-absorption intensity modulator (EAM) can be processed by etching away the laser multi-quantum-well MQW layers. Higher laser output (exit power) can be achieved by incorporating distributed phase shifts and/or chirped grating across the length of a distributed feedback (DFB) section. An injection current to a phase control section can produce a change in distributed feed back (DFB) laser wavelength. A reverse-voltage to an electro-absorption intensity modulator (EAM) 420 can change in a refractive index by Quantum Confined Stark Effect (QCSE). The advantages of this tunable laser design are (1) high single-mode stability due to a distributed feed back (DFB) section, (2) higher output (exit) power due to a distributed Bragg reflector (DBR) section and (3) rapid wavelength tuning by an injection current to a phase control section and/or reverse voltage to an electro-absorption intensity modulator (EAM) 420.

A stacked multi-quantum well (MQW) cross-sectional layer design of an electro-absorption modulator (EAM) with a DR laser is illustrated in table 1 below.

TABLE 1

| | Thickness (nm) | N-/P-Doping (10^18/cm^3) | Composition In(1 − x)Ga(x)As(y)P(1 − y) | Bandgap Wavelength (nm) | Strain (%) | Material Index |
|---|---|---|---|---|---|---|
| Substrate | 100 × 10^3 | N 3.0 | X = 0.000 Y = 0.000 | 918.6 | 0 | 3.1694 |
| Buffer | 1 × 10^3 | N 1.0 | X = 0.000 Y = 0.000 | 918.6 | 0 | 3.1694 |
| 1.15Q | 70 | N 0.5 | X = 0.181 Y = 0.395 | 1150 | 0 | 3.3069 |
| 1.20Q | 50 | N 0.5 | X = 0.216 Y = 0.469 | 1200 | 0 | 3.3345 |
| 1.10Q | 10 | N 0.001 | X = 0.145 Y = 0.317 | 1100 | 0 | 3.2784 |
| EAM Well-1 | 8 | N 0.001 | X = 0.463 Y = 0.930 | 1550 | TS0.2 | 3.5533 |
| 1.10Q | 6 | N 0.001 | X = 0.145 Y = 0.317 | 1100 | 0 | 3.2784 |
| EAM Well-2 | 8 | N 0.001 | X = 0.463 Y = 0.930 | 1550 | TS0.2 | 3.5533 |
| 1.10Q | 6 | N 0.001 | X = 0.145 Y = 0.317 | 1100 | 0 | 3.2784 |
| EAM Well-3 | 8 | N 0.001 | X = 0.463 Y = 0.930 | 1550 | TS0.2 | 3.5533 |
| 1.10Q | 6 | N 0.001 | X = 0.145 Y = 0.317 | 1100 | 0 | 3.2784 |
| EAM Well-4 | 8 | N 0.001 | X = 0.463 Y = 0.930 | 1550 | TS0.2 | 3.5533 |
| 1.10Q | 6 | N 0.001 | X = 0.145 Y = 0.317 | 1100 | 0 | 3.2784 |
| EAM Well-5 | 8 | N 0.001 | X = 0.463 Y = 0.930 | 1550 | TS0.2 | 3.5533 |
| 1.10Q | 6 | N 0.001 | X = 0.145 Y = 0.317 | 1100 | 0 | 3.2784 |
| EAM Well-6 | 8 | N 0.001 | X = 0.463 Y = 0.930 | 1550 | TS0.2 | 3.5533 |
| 1.10Q | 10 | N 0.001 | X = 0.145 Y = 0.317 | 1100 | 0 | 3.2784 |
| Stop-Etch | 50 | N 0.001 | X = 0.000 Y = 0.000 | 918.6 | 0 | 3.1694 |
| *1.25Q | 10 | N 0.001 | X = 0.239 Y = 0.533 | 1250 | 0 | 3.3588 |
| *DR Well-1 | 5 | N 0.001 | X = 0.239 Y = 0.839 | 1642 | CS1.05 | 3.4971 |
| *1.25Q | 10 | N 0.001 | X = 0.239 Y = 0.533 | 1250 | 0 | 3.3588 |
| *DR Well-2 | 6 | N 0.001 | X = 0.239 Y = 0.839 | 1642 | CS1.05 | 3.4971 |
| *1.25Q | 10 | N 0.001 | X = 0.239 Y = 0.533 | 1250 | 0 | 3.3588 |
| *DR Well-3 | 5 | N 0.001 | X = 0.239 Y = 0.839 | 1642 | CS1.05 | 3.4971 |
| *1.25Q | 10 | N 0.001 | X = 0.239 Y = 0.533 | 1250 | 0 | 3.3588 |
| *DR Well-4 | 6 | N 0.001 | X = 0.239 Y = 0.839 | 1642 | CS1.05 | 3.4971 |
| *1.25Q | 10 | N 0.001 | X = 0.239 Y = 0.533 | 1250 | 0 | 3.3588 |
| *1.20Q | 50 | P 0.2 | X = 0.216 Y = 0.469 | 1200 | 0 | 3.3345 |
| **Grating: 1.15Q | 50 | P 0.2 | X = 0.181 Y = 0.395 | 1150 | 0 | 3.3069 |
| Cladding | 1.5 × 10^3 | P 0.2~P 2.0 | X = 0.000 Y = 0.000 | 918.6 | 0 | 3.1694 |
| 1.30Q | 50 | P 5.0 | X = 0.280 Y = 0.606 | 1300 | 0 | 3.3871 |
| Cap | 200 | P 30 | X = 0.468 Y = 1.000 | 1654 | 0 | 3.5610 |

EAM: Electro-absorption modulator
DR: Laser
TS: Tensile
CS: Compressive

*These laser layers must be removed in EAM section and be replaced/re-gown with InP layer of total thickness of ~172 nm.
**λ/4 phase shifted gratings (at the DFB section of DR laser) are fabricated on this layer with 50% duty cycle at 40 nm grating etch depth.

Figure 3B:
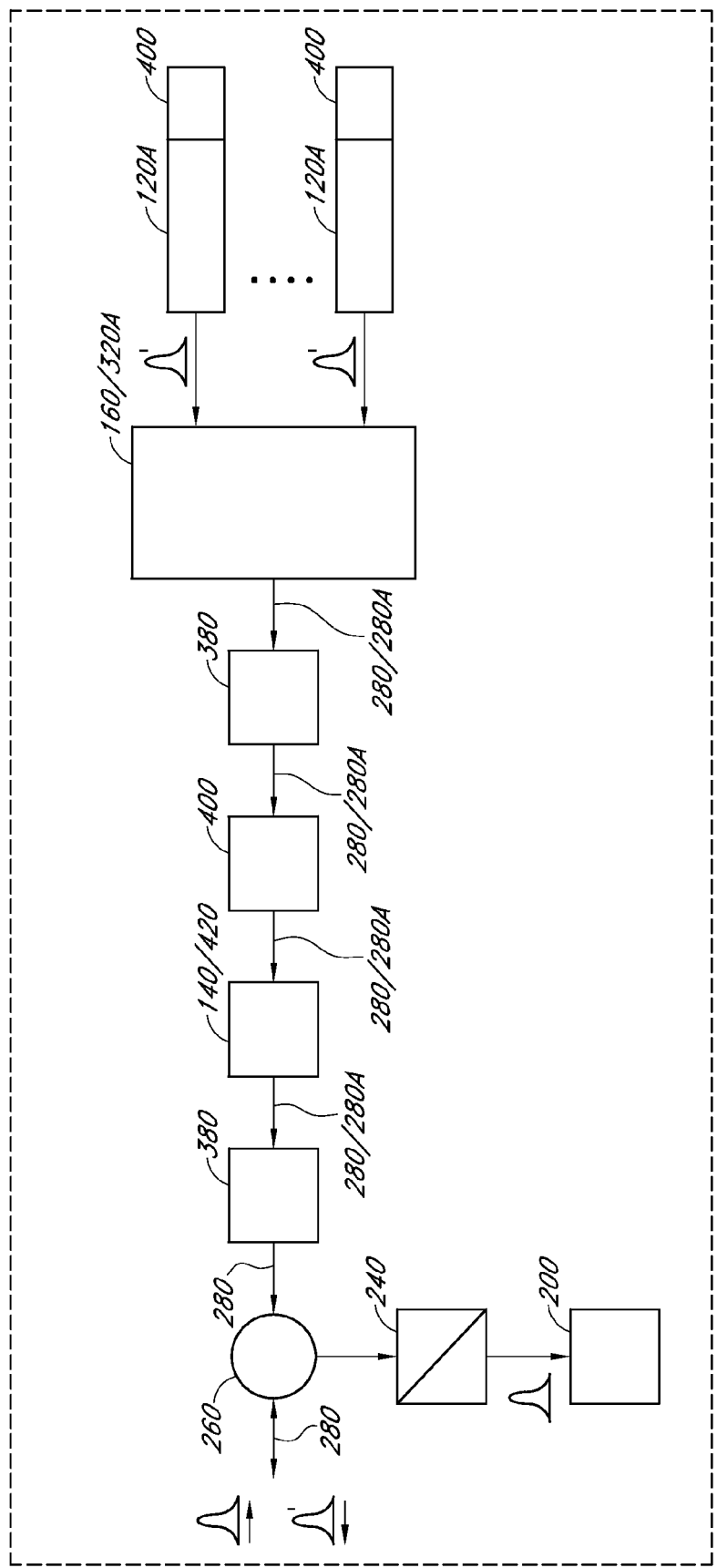
FIG. 3B illustrates a block diagram construction (configuration) of a wavelength tunable (widely) laser array module, according to another embodiment of the present invention.

FIG. 3B illustrates a block diagram construction (configuration) of a single-mode/mode-hopp free wavelength tunable (widely) laser array, which can be integrated with a wavelength combiner 160 or a Y/multi-mode interference optical power combiner 320A, a tilted/curved semiconductor optical amplifier 380, a phase modulator 400 (if needed), an intensity modulator 140/420 and a tilted/curved semiconductor optical amplifier 380 via an waveguide 280A/single-mode fiber 280. The back facet of an electro-absorption modulator (EAM) segment 400 has a low anti-reflection coating, while the front facet of a last optical modulator 380 an ultra-low anti-reflection coating. An upstream wavelength (embedded with an optical signal) generated utilizing a tunable laser module at an intelligent subscriber subsystem 340, is passed through a 3-port circulator module 260 at a remote node 103 and transmitted to a super node 101. A downstream wavelength from a super node 101, is passed through a 3-port circulator 260, a bandpass optical filter module 240 and a photodiode module 200 at a remote node.

According to another embodiment of the present invention, that a subset of a second set of wavelengths (which are offset in wavelengths with respect to a first set of wavelengths transmitted from the super node 101) can be modulated at a bit-rate (e.g., 10 Gb/s or higher Gb/s, but a variable modulation bit-rate is preferred) and thus configured to be shared with a number of intelligent subscriber subsystems 340 to generate a symmetric upstream bandwidth/bandwidth on-Demand.

Both downstream and upstream wavelengths can be protected by a 2×2 optical protection switch module and separated via an optical ring-network comprising of redundant/multiple dispersion-compensated single-mode optical fibers 280.

A pilot tone modulation can be added to a semiconductor optical amplifier module 380 within an optical processing micro-subsystem 360 (within an intelligent subscriber subsystem 340) and to laser modules 120 (at a super node 101 and a local node 102) to reduce Rayleigh backscattering effect.

An electronic dispersion compensation circuit and a forward error correction circuit can be added to relax the specifications of optical and/or electronic modules. Furthermore, all optical single-mode fibers can be polished at an angle (about 7 degree) to reduce any optical back-reflection.

According to another embodiment of the present invention, an upstream wavelength may be shared/transmitted by a number of intelligent subscriber subsystems 340 utilizing a time division multiplexed statistical bandwidth allocation method. Therefore, a burst mode receiver circuit is needed at a super node 101 to process bursty optical signals embedded in the upstream wavelengths from a number of intelligent subscriber subsystems 340.

Furthermore, to enable a higher bit-rate, a modulator/demodulator of an advanced modulation format (e.g., differential quadratic phase-shift keying-DQPSK and/or quadratic amplitude modulation-QAM) can be utilized.

Figure 4:
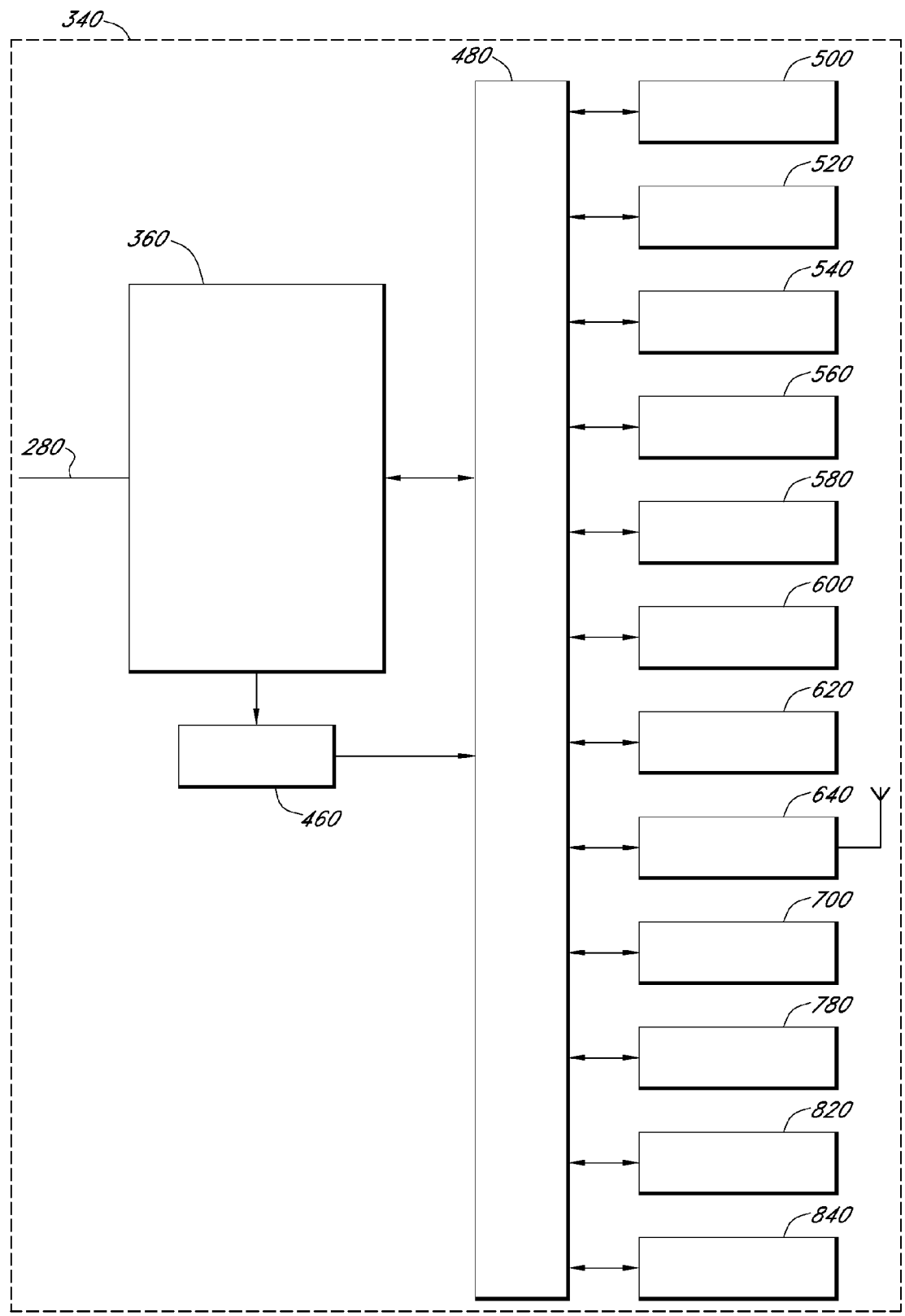
FIG. 4 illustrates a block diagram construction (configuration) of an intelligent subscriber subsystem 340, according to another embodiment of the present invention.

FIG. 4 illustrates a block diagram construction (configuration) of an intelligent subscriber subsystem 340, according to another embodiment of the present invention, wherein an intelligent subscriber subsystem 340 comprises an optical processing micro-subsystem 360 (for separating and providing a downstream wavelength to a photodiode module 200 and optically processing an upstream wavelength to a super node 101). A photodiode module 200 within an optical processing micro-subsystem 360 is connected/coupled/interacted with an optical-to-electrical amplifier circuit 460 and a media access controller (with processing, routing and quality of service (QoS) functions) module and a module specific software 480. A media access controller module and a module specific software 480 is connected/coupled/interacted with one or more of the following: (a) an IP/micro IP/light weight IP address module and a module specific software 500, (b) security module (an Internet firewall/spyware/user-specific security control/authentication) and a module specific software 520, (c) an in-situ/remote diagnostic module and a module specific software 540, (d) a content transfer module and a module specific software 560, (e) a time-shift (time-shift is a recording of content to a storage medium for consuming at a later time) module and a module specific software 580, (f) a place-shift (place-shift is consuming a stored content on a remote appliance/subsystem/system/terminal via an Internet) module and a module specific software 600, (g) a content (voice-video-multimedia-data) over-IP module and a module specific software 620, (h) a radio module (with antenna(s)), wherein the radio module comprises one or more of the following modules: a RFID (active/passive), a Wibree, a Bluetooth, a Wi-Fi, an ultra-wideband, a 60-GHz/millimeter wave, a Wi-Max/4G/higher frequency radio and an indoor/outdoor position module (e.g., a Bluetooth, a Wi-Fi, a GPS and an electronic compass) and a module specific software 640, (i) a software module 700, which comprises one or more of the following: an embedded/cloud based operating system software and an embedded/cloud based intelligence rendering software (e.g., a surveillance software, a behavior modeling (www.choicestream.com), a predictive analytics/text/data/pattern mining/natural language (www.sas.com), a fuzzy logic/artificial intelligence/neural network (www.nd.com/bliasoft.com), a machine learning/iterative learn-by-doing/natural learning (www.saffron.com) and an intelligent agent (cougaarsoftware.com), (j) a memory/storage module and a module specific software 780, (k) a sensor module and a module specific software 820 and (l) a battery/solar cell/micro fuel-cell/wired power supply module and a module specific software 840.

Furthermore, a system-on-a-chip, integrating a processor module and a module specific software 760 with a graphic processor module, an Internet firewall, a spyware and a user-specific security control/authentication can simplify a construction of an intelligent subscriber subsystem 340.

An intelligent subscriber subsystem 340 comprises a set top box/personal video recorder/personal server components/modules. An intelligent subscriber subsystem 340 comprises a voice-to-text-to-voice processing module and a module specific software. (e.g., Crisp Sound is a real time audio signal processing software for echo cancellation, background noise reduction, speech enhancement and equalization), a video compression module and a module specific software, a photo-editing software module and a software module for automatically uploading content to a preferred remote/cloud server.

An intelligent subscriber subsystem 340 has multiple radio modules with multiple antennas. A tunable radio-frequency carbon nano-tube (CNT) cavity can tune in between 2 GHz and 3 GHz. Merging many antennas utilizing a tunable carbon nano-tube (CNT) cavity and an analog/digital converter, it can enable a simplified software-defined radio.

An intelligent subscriber subsystem 340 that it can enable content over-IP, (e.g., Skype service) thus disrupting a traditional carrier controlled fixed telephony business model.

According to another embodiment of the present invention, a secure delivery of a content optical signal to an intended destination can be achieved by utilizing a low bit-rate destination marker optical signal, which is modulated at a different plane with a different modulation format, simultaneously in conjunction with a higher-bit rate content optical signal. The low bit-rate destination marker optical signal is extracted and converted from an optical domain to an electrical domain to determine an intended destination of a content optical signal, while a content optical signal remains in an optical domain until it is delivered to an intended destination—thus both routing and security in the delivery of a content optical signal are significantly enhanced.

Figure 5:
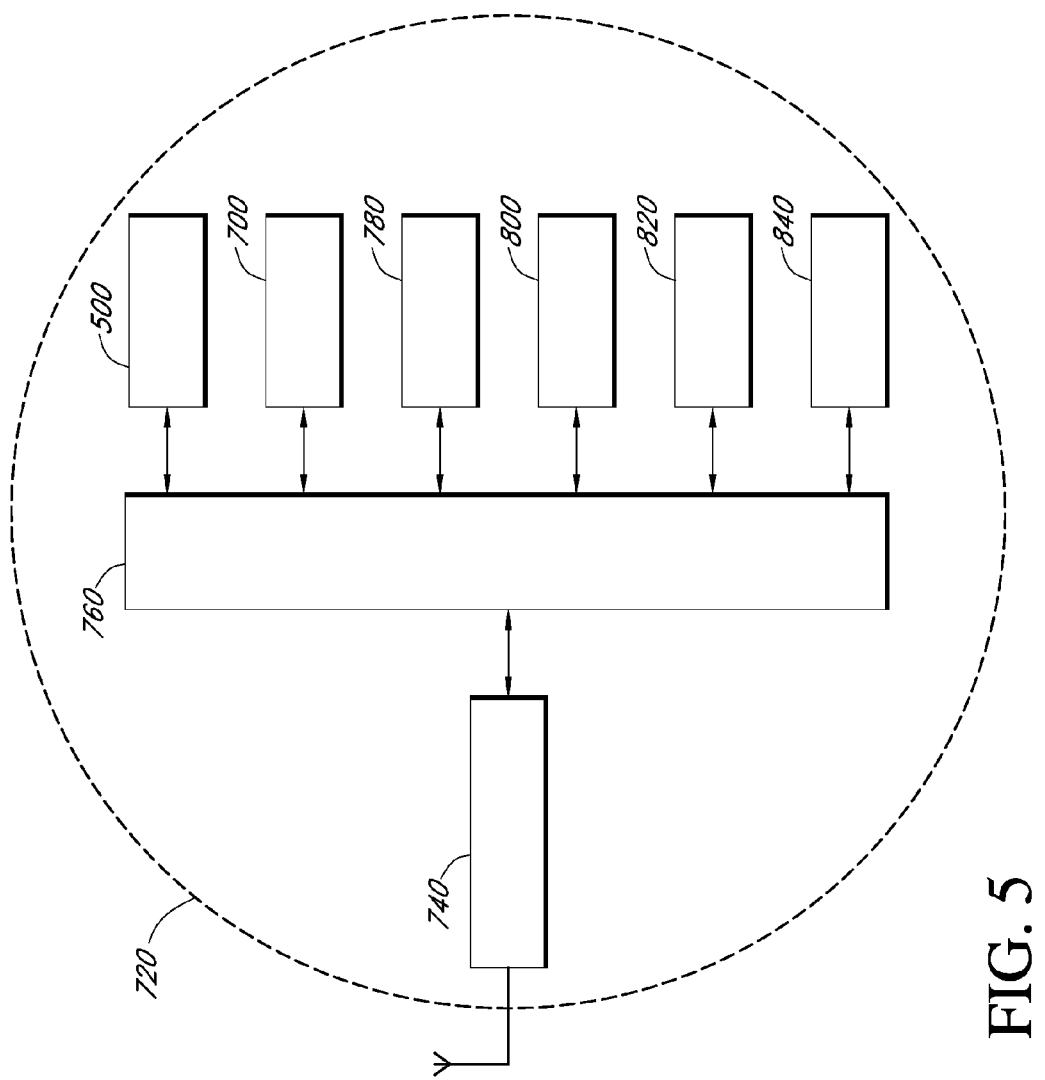
FIG. 5 illustrates a block diagram construction (configuration) of an object 720, according to another embodiment of the present invention.

FIG. 5 illustrates a block diagram construction (configuration) of a micro-sized (about 15 mm$^3$) object 720, having a processor (e.g., ultra-lower power consumption ARM Cortex™-M3/micro-controller-www.ambiqmicro.com/based on nano-scaled InAs XOI) module and a module specific software 760 is connected/coupled/interacted with one or more of the following: (a) an IP/micro IP/light weight IP address module and a module specific software 500, (b) a software module 700 (e.g., a Tiny OS-operating system/IBM mote runner), (c) an "object specific" radio module with antenna(s) (which comprises one or more of the following, a RFID (active/passive), an ultra-low power radio, a Wibree, a Bluetooth and a near-field communication (NFC) 740, (d) a memory/storage module and a module specific software 780, (e) a camera module (a MEMS based camera is preferred) and a module specific software 800, (f) a sensor (e.g., a radio enabled micro-electro-mechanical sensor) module and a module specific software 820 and (g) a battery/solar cell/ micro fuel-cell wired power supply/wired power supply module and a module specific software 840.

A battery/solar cell (e.g., Silicon)/micro fuel-cell/wired power supply/resonant electro-magnetic inductive coupling energy transfer (wireless) power supply module and a module specific software 840 can include a thick/thin film (e.g., 3.6V 12 μAh Cymbet thin-film lithium battery) printed/3-D/nano-engineered battery (e.g., cellulose-a spacer ionic liquid electrolyte, electrically connected/coupled/interacted with a carbon nano-tube (CNT) electrode and a Lithium Oxide electrode), a nano-super-capacitor (e.g., utilizing carbon nano-tube (CNT) ink, or operating due to fast ion transport at a nano-scale), a nano-electrical generator of piezoelectric PZT nano-wires (e.g., n-/p-type Zinc Oxide nano-wires. 20,000 Zinc Oxide nano-wires can generate about 2 mW), a nano-electro-mechanical systems (NEMS) cell (e.g., a motor protein cell) and a microbial nano fuel-cell.

A motor protein (macromolecule) named prestin, which is expressed in outer hair cells in the organ of Corti of a human ear and it is encoded by the SLC26A5 gene. Prestin converts an electrical voltage into a motion by elongating and contracting outer hair cells. This motion amplifies sound in a human ear. However, prestin can work in a reverse mode, producing an electrical voltage in response to a motion. To increase conductivity, a microbe (e.g., a bacterium Pili) can act as a conducting nano-wire to transfer electrons generated by prestin. Each prestin is capable of making only nano watts of electricity. A prestin cell (array of prestins, connected/coupled/interacted between two electrodes) can electrically charge a battery/solar cell/micro fuel-cell/wired power supply module. A prestin cell can grow and self-heal, as it is constructed from biological components. Furthermore, a nano-electrical generator of piezoelectric PZT nano-wires can be integrated with prestin.

A memristor component can replace both a processor component and/or a memory/storage component. Furthermore, a memristor component and a nano-sized radio component can reduce power consumption of an object 720.

A sensor module and a module specific software 820 can include a biological sensor (e.g., to monitor/measure a body temperature, % oxygen, a heart rhythm, a blood glucose concentration and a bio-marker for a disease parameter).

An object 720 with a biological/bio-marker sensor, a transistor, a LED, a nano-sized radio, a prestin cell and an object specific software can be incorporated onto a support material (e.g., a silk membrane) to monitor/measure (and transmit) a disease parameter.

Another example of a biological sensor can be described as follows: an assassin protein (macromolecule) perforin is immune system's weapon of mass destruction. Perforin is encoded by the PRFI gene. Perforin is expressed in T cells and natural killer (NK) cells. Interestingly, perforin resembles a cellular weapon employed by a bacterium (e.g., anthrax). Perforin has an ability to embed itself to form a pore in a cell-membrane. The pore by itself may be damaging to a cell and it enables an entry of a toxic enzyme granzyme B, which induces an apoptosis (a programmed suicide process) of a diseased cell. However, perforin occasionally misfires—killing a wrong cell (e.g., an insulin producing pancreas) and significantly accelerating a disease like diabetes. Defective perforin leads to an upsurge in cancer malignancy (e.g., leukemia). Up regulation of perforin can be effective against cancer and/or an acute viral disease (e.g., cerebral malaria). Down regulation of perforin can be effective against diabetes. The ramification of a pore-forming macromolecule like perforin is enormous, if it can be tailored/tuned to a specific disease.

Like perforin, an ultrasonically guided micro-bubble can break in a cell-membrane. A pore-forming micro-bubble (ultrasonically guided)/nano-vessel (e.g., a cubisome/liposome) encapsulating a suitable chemical(s)/drug(s), a surface modified-red fluorescent protein (e.g., E2-Crimson) and perforin (if needed) can be an effective imaging/drug delivery method. A surface coating (e.g., a pegylation) on a micro-bubble/ nano-vessel can avoid an immune surveillance of a human body. A surface coating of disease-specific ligand (e.g., an antibody) on a micro-bubble/nano-vessel can enhance the targeting to specific disease cells. Furthermore, an encapsulation of magnetic super-paramagnetic nano-particles within a micro-bubble/nano-vessel can significantly enhance the targeting to specific disease cells, when it is guided by a magnet. A micro-bubble/nano-vessel can be incorporated within a silicone micro-catheter (silver nano-particle coated) tube or a micro-electrical-mechanical-systems (MEMS) reservoir/micro-pump (integrated with an array of silicon micro-needles) on a support material.

For utilizing an object 720 within and/or on a human body, all components must be biocompatible (bio-dissolvable is preferred).

If a disease parameter measurement is perceived to be abnormal with respect to a reference disease parameter measurement, a biological sensor module connects/couples/interacts with an object 720 for a programmed drug delivery. Furthermore, an object 720 can connect/couple/interact (via one or more or all electrical/optical/radio/electro-magnetic/ sensor/bio-sensor communication network(s) within and/or to and/or from an object) with an intelligent subscriber subsystem 340 and/or an intelligent appliance 880 for a location based/assisted emergency help without a human input.

An object 720 can be constructed utilizing a system-on-a-chip/a system-in-a-package/multi-chip module.

An object 720 can sense/measure/collect/aggregate/compare/map and connect/couple/interact/share (via one or more or all electrical/optical/radio/electro-magnetic/sensor/bio-sensor communication network(s) within and/or to and/or from an object) with an intelligent subscriber subsystem 340 and an intelligent appliance 880 utilizing an Internet protocol version 6 (IPv6) and its subsequent versions.

A method of securing information by an object 720, comprising at least the following steps of: (a) sensing 900, (b) measuring 920, (c) collecting 940, (d) aggregating/comparing/mapping 960, (e) connecting/coupling/interacting/sharing 980 (in real time) with a plurality of objects 720, intelligent subscriber subsystems 340 and intelligent appliances 880, (f) developing a learning algorithm (e.g., a machine learning/iterative learn-by-doing/natural learning algorithm in a software module 700) 1300 from the activities of a plurality of objects 720, intelligent subscriber subsystems 340 and intelligent appliances 880, (g) utilizing a learning algorithm 1320 and (h) re-iterating all the previous steps from (a) to (g) in a loop cycle 1340 to enable an intelligent decision based on information from a plurality of objects 720, intelligent subscriber subsystems 340 and intelligent appliances 880.

Figure 6:
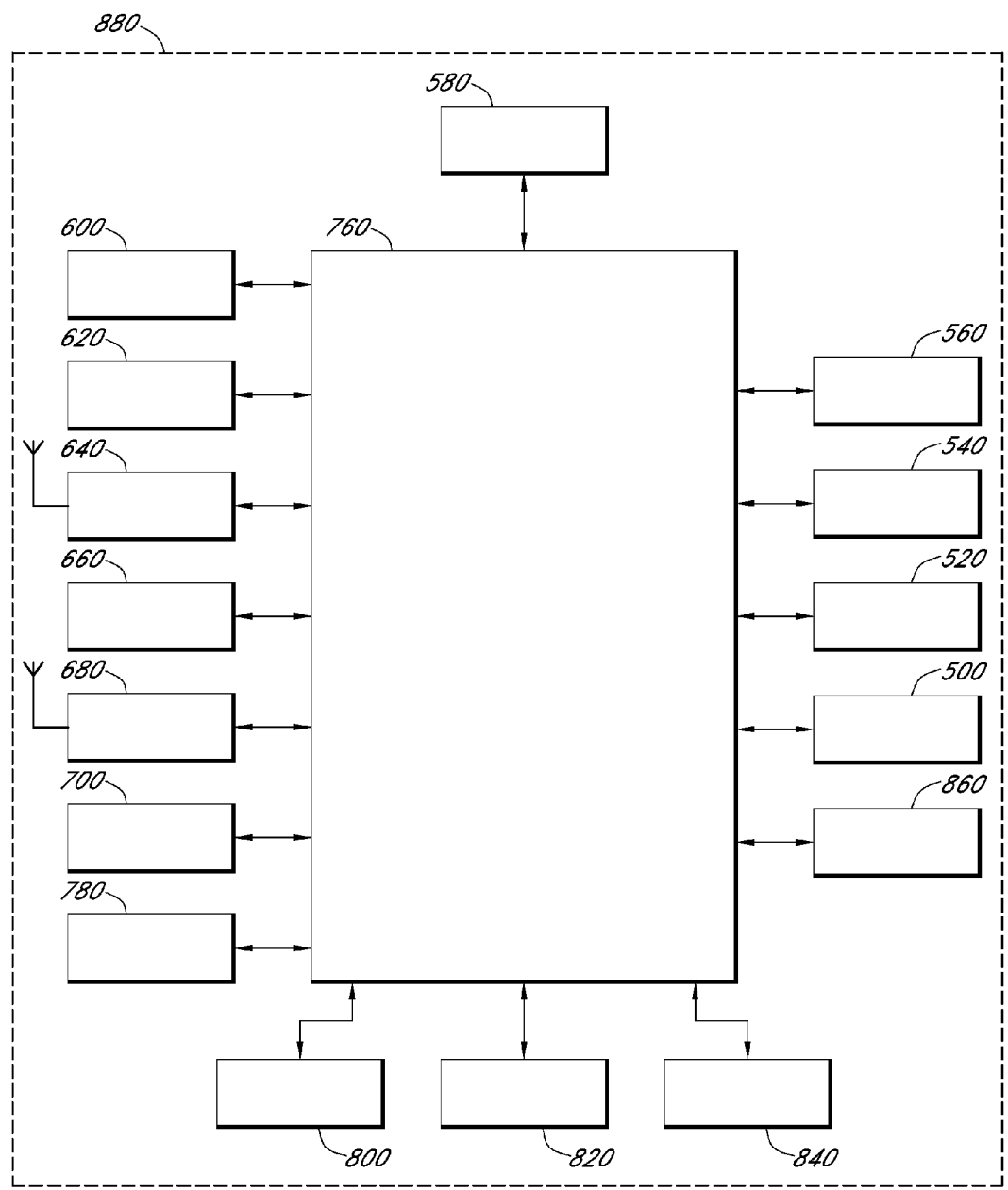
FIG. 6 illustrates a block diagram construction (configuration) of an intelligent appliance 880, according to another embodiment of the present invention.

FIG. 6 illustrates a block diagram construction (configuration) of an intelligent appliance (about 125 mm long, 75 mm wide and 20 mm thick) 880, according to another embodiment of the present invention. A processor (performance at a lower electrical power consumption is desired e.g., Graphene processor) module and a module specific software 760 is connected/coupled/interacted (via one or more or all electrical/optical/radio/electro-magnetic communication network(s) within and/or to and/or from an intelligent appliance) with one or more of the following: (a) an IP/micro IP/light weight IP address module and a module specific software 500, (b) security module (an Internet firewall/spyware/user-specific security control/authentication) and a module specific software 520, (c) an in-situ/remote diagnostic module and a module specific software 540, (d) a content transfer module and a module specific software 560, (e) a time-shift module and a module specific software 580, (f) a place-shift module and a module specific software 600, (g) a content (voice-video-multimedia-data) over-IP module and a module specific software 620, (h) a radio module (with antenna(s)), wherein the radio module comprises one or more of the following modules: a RFID (active/passive), a Wibree, a Bluetooth, a Wi-Fi, an ultra-wideband, a 60-GHz/millimeter wave, a Wi-Max/4G/higher frequency radio and an indoor/outdoor position module (e.g., a Bluetooth, a Wi-Fi, a GPS and an electronic compass) and a module specific software 640, (i) a 1-D/2-D barcode/QR-code scanner/reader module and a module specific software 660, (j) a near-field communication (NFC) module (with an antenna) and a module specific software 680, (k) a software module 700, which comprises one or more of the following: an embedded/cloud based operating system software and an embedded/cloud based intelligence rendering software (e.g., a behavior modeling (www.choicestream.com), a predictive analytics/text/data/pattern mining/natural language (www.sas.com), a fuzzy logic/artificial intelligence/neural network (www.nd.com/bliasoft.com), a machine learning/iterative learn-by-doing/natural learning (www.saffron.com) and an intelligent software agent (cougaarsoftware.com)), (l) a memory/storage module and a module specific software 780, (m) a camera (a 180 degree rotating camera module is preferred) and a module specific software 800, (n) a sensor module and a module specific software 820, (o) a battery/solar cell/micro fuel-cell/wired power supply module and a module specific software 840 and (p) a display (a foldable/stretchable with a touch sensor is preferred) module and a module specific software 860. An intelligent appliance 880 comprises a socket (e.g., SIM/SD).

Furthermore, a system-on-a-chip, integrating a processor module and a module specific software 760 with a graphic processor module, an Internet firewall, a spyware and a user-specific security control/authentication can simplify a construction of an intelligent appliance 880.

Furthermore, a super-capacitor (manufactured by www.cap-xx.com) and/or proton exchange membrane micro fuel-cell can enhance an operational time of a battery/solar cell/micro fuel-cell/wired power supply component.

A foldable/stretchable display component can be constructed from a graphene sheet and/or an organic light-emitting diode connecting/coupling/interacting with a printed organic transistor and a rubbery conductor (e.g., a mixture of a carbon nano-tube (CNT)/gold conductor and a rubbery polymer) with a touch/multi-touch sensor.

An intelligent appliance 880 comprises a voice-to-text-to-voice processing module and a module specific software. (e.g., Crisp Sound is a real time audio signal processing software for echo cancellation, background noise reduction, speech enhancement and equalization), a video compression module and a module specific software, a photo-editing software module and a software module for automatically uploading content to a preferred remote/cloud server.

An intelligent appliance 880 can be much thinner than 20 mm, if both display and battery components are thinner.

A thinner photonic crystal display component can be constructed as follows: optically pumps different-sized photonic crystals, whereas the photonic crystals can individually emit blue, green and red light based on their inherent sizes. An optical pump can be generated from an optical emission by an electrical activation of semiconductor quantum-wells. Blue, green and red light can be multiplexed/combined to generate a white light.

A thinner organic battery component can be constructed as follows: an organic battery utilizes push-pull organic molecules, wherein after an electron transfer process, two positively charged molecules are formed which are repelled by each other like magnets. By installing a molecular switch an electron transfer process can proceed in an opposite direction. Thus forward and backward switching of an electron flow can form a basis of an ultra-thin, light weight and power efficient organic battery.

An intelligent appliance 880 can be integrated with a miniature surround sound (e.g., a micro-electrical-mechanical-systems (MEMS) based silicon microphone component-Analog ADMP 401/an equivalent component from www.akustica.com) module and a module specific software, a miniature power efficient projection (e.g., a holographic/micro-mirror projector) module and a module specific software, an infrared transceiver module and a module specific software and a biometric sensor (e.g., a finger-print/retinal-scan) module and a module specific software.

A projection module can be miniaturized by utilizing one tilt-able one mm diameter single crystal mirror. The mirror deflects a laser (blue, green and red) beam by rapidly switching its angle of orientation, building up a picture pixel by pixel.

An array of (at least four) front-facing cameras can provide stereo views and motion parallax (apparent difference in a direction of movement produced relative to its environment). Each camera can create a low dynamic range depth map. However, an array of cameras can create a high dynamic range depth map-thus an intelligent appliance 880 can enable a 3-D video conference.

An intelligent appliance 880 has multiple radio modules with multiple antennas. These multiple radio modules with multiple antennas can be simplified by a software-defined radio.

An augmented reality allows a computer-generated content to be superimposed over a live camera-view in a real world. An intelligent appliance 880 can be integrated with an augmented reality to enrich a user's experience and need.

An intelligent appliance 880 can acquire information on a barcode/RFID/near-field communication (NFC) tag on a product by utilizing its radio module. An intelligent appliance 880 is aware of its location via its indoor/outdoor position module (within a radio module and a module specific software 640) and it can search for a price/distribution location. Thus, an intelligent appliance 880 can enable a real-world physical search.

An intelligent appliance 880 that it can enable content over-IP (e.g., Skype service) via an ambient Wi-Fi/Wi-Max network, thus disrupting a traditional carrier controlled cellular business model.

Near-field communication (NFC) has a short range of about 35 mm-making it an ideal choice for a contact-less (proximity) application. Near-field communication (NFC) module (with an antenna) and a module specific software 680 can allow a user to learn/exchange/transfer/share/transact in a contact-less (proximity) application in real time. A standalone near-field communication (NFC) enabled micro-subsystem (e.g., a SD/SIM card form factor) can integrate an IP/micro IP/light weight IP address module and a module specific software 500, a storage/memory module and a module specific software 780, a near-field communication (NFC) module (with an antenna) and a module specific software 680 and a software module 700. To exchange/transfer/share/transact content, a radio module and a module specific software 640 can be integrated with a standalone near-field communication (NFC) enabled micro-subsystem. To enhance the security of a standalone near-field communication (NFC) enabled micro-subsystem, a sensor module (e.g., a 0.2 mm thick finger-print sensor component (manufactured by Seiko Epson) reads an electric current on a user's finger-tip contact or a sensor component uniquely synchronized with another sensor component) and a module specific software 820 can be integrated. Furthermore, an advanced biometric (finger-print) sensor module can be constructed by combining a silica colloidal crystal with a rubber, wherein the silica colloidal crystal can be dissolved in dilute hydrofluoric (HF) acid-leaving air voids in a rubber, thus creating an elastic photonic crystal. An elastic photonic crystal emits an intrinsic color, displaying 3-D shapes of ridges, valley and pores of a finger-print, when pressed onto. A processor module and a module specific software 760 can be utilized to compare with a user's captured/stored finger-print data. A non-matching finger-print data would render a standalone micro-subsystem unusable in an abuse/fraud/theft.

Five critical contact-less (proximity) applications are: (a) Product/service discovery/initiation, (b) peer-to-peer exchange/transfer/share/transaction (c) machine-to-machine exchange/transfer/share/transaction and (d) remote access of an appliance/subsystem/system/terminal and (e) access authentication.

Product/Service Discovery/Initiations

A standalone near-field communication (NFC) enabled micro-subsystem, in contact-less proximity of another near-field communication (NFC) enabled appliance/subsystem/system/terminal, receives an URL (web site) to (a) provide an information about a product/service, (b) receive a direct and/or peer-to-peer marketing (e.g., a coupon/advertisement/promotion/brand loyalty program) and (c) monitor/measure an effectiveness of a marketing campaign.

Peer-to-Peer Exchange/Transfer/Share/Transaction

A user can share a social network/business profile/micro-loan/micro-content in contact-less proximity of a near-field communication (NFC) enabled appliance/subsystem/system/terminal of another user.

Machine-to-Machine Exchange/Transfer/Share/Transaction

A user can transact money/micro-loan/micro-content in contact-less proximity of a near-field communication (NFC) enabled appliance/subsystem/system/terminal.

An example, a standalone near-field communication (NFC) enabled micro-subsystem can enable printing a stored photo, in contact-less proximity of a near-field communication (NFC) enabled printer and displaying a stored movie, in contact-less proximity of a near-field communication (NFC) enabled TV.

A near-field communication (NFC) enabled TV can be constructed similarly to an intelligent appliance 880.

Another example, a standalone near-field communication (NFC) enabled micro-subsystem can enable purchasing a travel ticket, in contact-less proximity of a near-field communication (NFC) enabled ticket appliance/subsystem/system/terminal. Such a ticket can be verified and/or located by an indoor position module without a need of a human input.

Another example, a near-field communication (NFC) enabled a printer module integrated with an electro-mechanical weighing module, an electro-mechanical postage dispending module and a software module for calculating the postage price based on weight, distance, priority level and delivery method, can enable purchasing postage efficiently.

Remote (Appliance/Subsystem/System/Terminal) Access

A user's profile, bookmark, address book, preference, setting, application and content of appliance/subsystem/system/terminal could be stored securely in a standalone near-field communication (NFC) enabled micro-subsystem, in contact-less proximity of a near field communication (NFC) enabled appliance/subsystem/system/terminal, it will load an original version of a user's profile, bookmark, address book, preference, setting, application and content.

Access Authentication

A user can utilize a standalone near-field communication (NFC) enabled micro-subsystem, in contact-less proximity of a near-field communication (NFC) enabled appliance/subsystem/system/terminal to enable authentication of an appliance/subsystem/system/terminal.

A standalone near-field communication (NFC) enabled micro-subsystem (as discussed above) can be integrated (by inserting into an electro-mechanical socket) with an intelligent appliance 880.

A direct marketing (e.g., a coupon/advertisement/promotion/brand loyalty program) exists via AdMob and Groupon. A static social network also exists via MySpace and Facebook. The primary motivation of a user is social connections with other users in a social network website. However, a web based social network can limit a human bond.

A standalone near-field communication (NFC) enabled micro-subsystem/intelligent appliance can enable an off-line social exchange and direct and/or a peer-to-peer marketing.

A personalized social network can utilize an augmented identity (e.g., Recognizr) in addition to a profile. A personalized social network can keep track of an information/discussion/interest, which are important to a user/users and makes such an information/discussion/interest available to a user/users when a user/users is either on-line and/off-line.

A direct marketing can be segmented by demographics/geographical locations (e.g., a gender/marital status/age/religion/interest/education/work-position/income/credit profile/net asset/zip code). However, adding real time geographical location to direct marketing can be useful (e.g., a user close to a stadium and minutes before an event, can purchase a ticket and after an event can receive direct marketing campaign based on a user's interests/preferences/patterns. This is a personalized marketing)

Personalization can be enhanced by an intelligence rendering software module (e.g., a machine learning/iterative learn-by-doing/natural learning algorithm in a software module 700). An intelligent software agent (a do-engine) can search an Internet automatically and recommend a user about a product/service/content based on a user's interests/preferences/patterns. An integration of a user social network profile, a user's interests/preferences/patterns, a user's real time geographical location, data/information/images from objects 720 and an interaction (of an object 720 with an intelligent subscriber subsystem 340 and an intelligent appliance 880) collectively can embed physical reality into an Internet space and an Internet reality into a physical space-thus it can enrich a user's experience and need.

Figure 7:
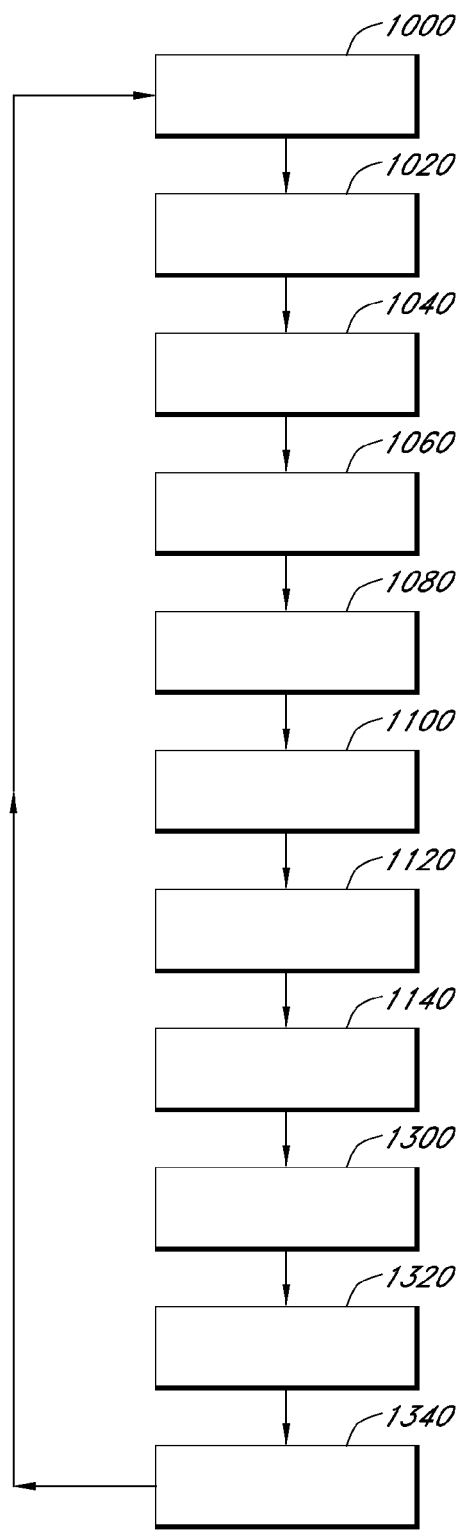
FIG. 7 illustrates a block diagram method flow-chart (configuration) of an intelligent, location based and personalized social network, according to another embodiment of the present invention.

FIG. 7 illustrates a block diagram method flow-chart (configuration) enabling an intelligent, location based and personalized social network can be realized by comprising at least the following steps of: (a) authenticating a user 1000, (b) understanding a user's profile (an augmented identity is preferred) 1020, (c) remembering a user's need 1040, (d) remembering a user's conversation 1060, (e) reminding a user's need 1080, (f) determining a user's location (real time is preferred) 1100, (g) searching an Internet for a user's need (an intelligent software agent is preferred) 1120, (h) recommending a product/service best suited for a user's need 1140, (i) developing a learning algorithm (e.g., a machine learning/iterative learning-by-doing/natural learning algorithm in a software module 700) 1300 from a plurality of users' activities, (j) utilizing a learning algorithm 1320 and (k) re-iterating all previous steps from (a) to (j) in a loop cycle 1340.

Figure 8:
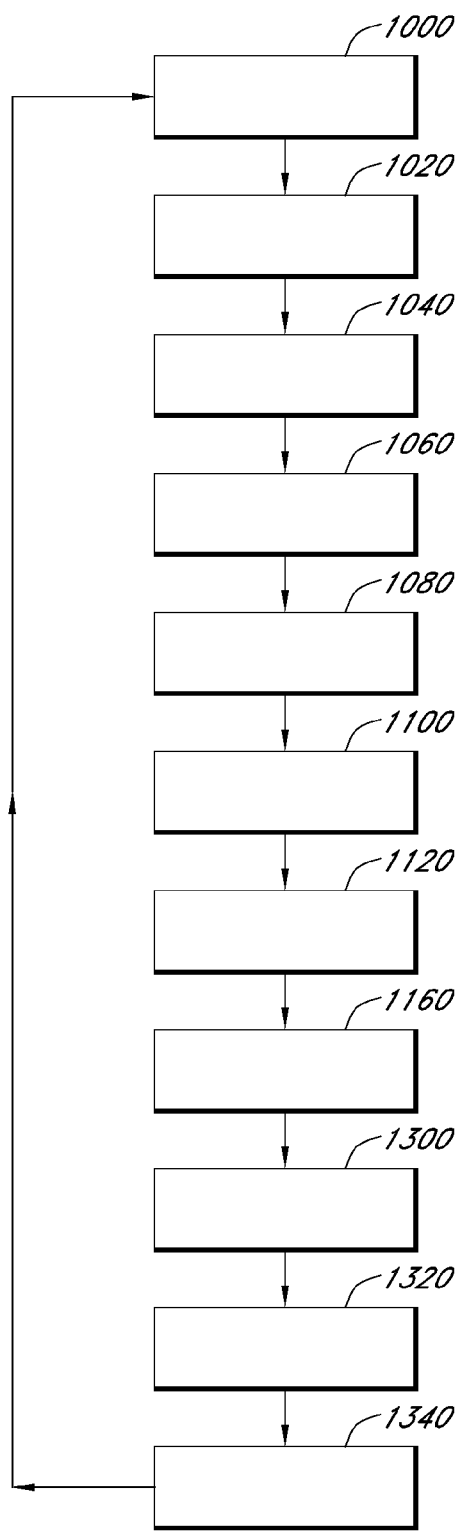
FIG. 8 illustrates a block diagram method flow-chart (configuration) of an intelligent, location based and personalized direct marketing, according to another embodiment of the present invention.

FIG. 8 illustrates a block diagram method flow-chart (configuration) enabling an intelligent, location based and personalized direct marketing (e.g., a coupon/advertisement/promotion/brand loyalty program) by comprising at least the following steps of (a) authenticating a user 1000, (b) understanding a user's profile (an augmented identity is preferred) 1020, (c) remembering a user's need 1040, (d) remembering a user's conversation 1060, (e) reminding a user's need 1080, (f) determining a user's location (real time is preferred) 1100, (g) searching an Internet for a user's need (an intelligent software agent is preferred) 1120, (h) delivering a direct marketing material (e.g., a coupon/advertisement/promotion/brand loyalty program) based on a user's need 1160, (i) developing a learning algorithm (e.g., a machine learning/iterative learning-by-doing/natural learning algorithm in a software module 700) 1300 from a plurality of users' activities, (j) utilizing a learning algorithm 1320 and (k) re-iterating all previous steps from (a) to (j) in a loop cycle 1340.

A method of enabling an intelligent, location based and personalized peer-to-peer marketing (e.g., a coupon/advertisement/promotion/brand loyalty program) can be realized by comprising at least the steps of: (a) authenticating a user 1000, (b) understanding a first user's profile (an augmented identity is preferred) 1020, (c) authenticating a second user 1000A, (d) understanding a second user's profile (an augmented identity is preferred) 1020A, (e) determining a first user's location (real time is preferred) 1100, (f) determining a second user's location (real time is preferred) 1100A, (g) communicating and/or sharing with a plurality of users for a collective need (an augmented identity is preferred) 1180, (h) determining users' locations (real time is preferred) 1100B, (i) delivering a marketing material (e.g., a coupon/advertisement/promotion/brand loyalty program) from a first user to a second user and/or users, seeking a marketing material (e.g., a coupon/advertisement/promotion/brand loyalty program) 1160A, (j) developing a learning algorithm (e.g., a machine learning/iterative learning-by-doing/natural learning algorithm in a software module 700) 1300 from a plurality of users' activities, (k) utilizing a learning algorithm 1320 and (o) re-iterating all previous steps from (a) to (k) in a loop cycle 1340.

A method of enabling an intelligent, location based and personalized peer-to-peer micro-loan transaction can be realized by comprising at least the steps of: (a) authenticating a user 1000, (b) understanding a first user's profile (an augmented identity is preferred) 1020, (c) authenticating a second user 1000A, (d) understanding a second user's profile (an augmented identity is preferred) 1020A, (e) determining a first user's location (real time is preferred) 1100, (f) determining a second user's location (real time is preferred) 1100A, (g) communicating and/or sharing with a plurality of users for a collective need (an augmented identity is preferred) 1180, (h) determining users' locations (real time is preferred) 1100B, (i) determining legal parameters of a micro-loan 1200, (j) agreeing on legal parameters of a micro-loan 1220, (k) establishing a security protocol between a first user and a second user and/or users, seeking a micro-loan 1240, (l) delivering a micro-loan from a first user to a second user and/or users, seeking a micro-loan 1160B, (m) developing a learning algorithm (e.g., a machine learning/iterative learning-by-doing/natural learning in a software module 700) 1300 from a plurality of users' activities, (n) utilizing a learning algorithm 1320 and (o) re-iterating all previous steps from (a) to (n) in a loop cycle 1340.

A method of enabling an intelligent, location based and personalized peer-to-peer micro-content transaction can be realized by comprising at least the steps of (a) authenticating a user 1000, (b) understanding a first user's profile (an augmented identity is preferred) 1020, (c) authenticating a second user 1000A, (d) understanding a second user's profile (an augmented identity is preferred) 1020A, (e) determining a first user's location (real time is preferred) 1100, (f) determining a second user's location (real time is preferred) 1100A, (g) communicating and/or sharing with a plurality of users for a collective need (an augmented identity is preferred) 1180, (h) determining users' locations (real time is preferred) 1100B, (i) determining legal parameters of a micro-content transfer 1200 (j) agreeing on legal parameters of a micro-content transfer 1220, (k) establishing a security protocol between a first user and a second user and/or users, seeking a micro-content transfer 1240, (l) delivering a micro-content from a first user to a second user and/or users, seeking a micro-content 1160C, (m) developing a learning algorithm (e.g., a machine learning/iterative learning-by-doing/natural learning algorithm in a software module 700) 1300 from a plurality of users' activities, (n) utilizing a learning algorithm 1320 and (o) re-iterating all previous steps from (a) to (n) in a loop cycle 1340.

Figure 9:
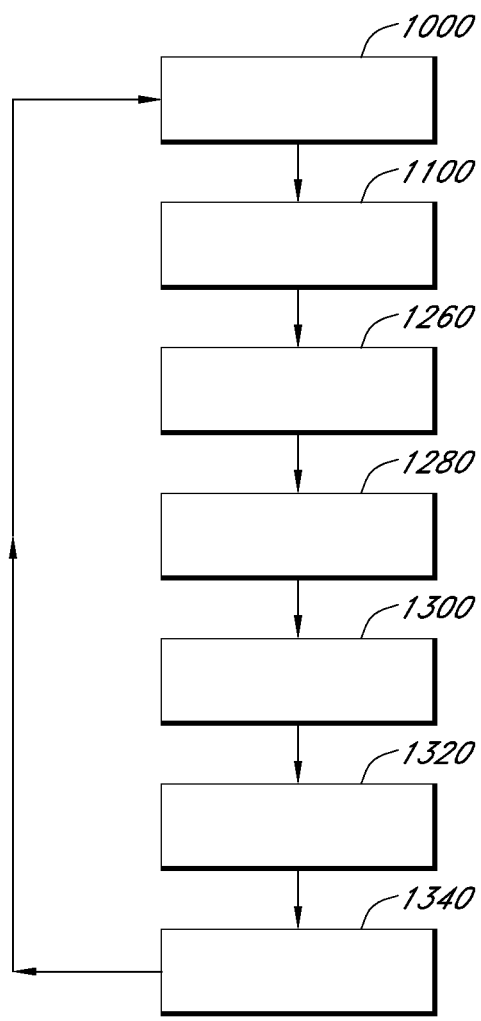
FIG. 9 illustrates a block diagram method flow-chart (configuration) of an intelligent, location based and personalized secure contact-less (proximity) Internet access authentication, according to another embodiment of the present invention.

FIG. 9 illustrates a block diagram method flow-chart (configuration) enabling an intelligent, location based and personalized secure contact-less (proximity) Internet access authentication can be realized by comprising at least the steps of: (a) authenticating a user 1000, (b) determining a first user's location (real time is preferred) 1100, (b) coming in proximity of a near-field enabled appliance/subsystem/system/terminal 1260, (c) authenticating the user for an Internet 1280, (d) developing a learning algorithm (e.g., a machine learning/iterative learning-by-doing/natural learning algorithm in a software module 700) 1300 from a plurality of users' activities, (e) utilizing a learning algorithm 1320 and (f) re-iterating all previous steps from (a) to (e) in a loop cycle 1340.

An intelligent software agent can also search an Internet automatically and recommend a user about a product/service/content based on a user's interests/preferences/patterns. An intelligence rendering software algorithm in a software module 700, allows an intelligent subscriber subsystem 340 and an intelligent appliance 880 to adapt/learn/relearn a user's interests/preferences/patterns and thereby rendering intelligence.

For example, a bedroom clock connects/couples/interacts with an intelligent subscriber subsystem 340 and/or an intelligent appliance 880, to automatically check on a traffic pattern/flight schedule via an Internet, before deciding whether to fiddle with an alarm time without a human input. A rechargeable toothbrush detects a cavity in the teeth, it sends a signal through its electrical wiring and connects/couples/interacts with an intelligent subscriber subsystem 340 and/or an intelligent appliance 880, automatically accesses a location based/assisted dentist's electronic appointment book for a consultation without a human input.

An intelligent appliance 880, can integrate a chemical/biological sensor module (e.g., to monitor/measure a body temperature, % oxygen, a heart rhythm, a blood glucose concentration, a carbonyl sulfide gas emission due to a liver/lung disease and a bio-marker for a disease parameter) with a module specific software.

A Zinc Oxide nano-structure can detect many toxic chemicals. Also a quantum cascade DFB/DBR/DR laser (with an emission wavelength in mid-to-far infrared range) can detect a part per billion amount of carbonyl sulfide gas. A wavelength switching of a quantum cascade DFB/DBR/DR laser can be achieved by temperature, utilizing a thin-film resistor/heater, while electrically insulating a laser bias current electrode. Wavelength switching by temperature is a slow (about ten milliseconds) thermal process. However, wavelength switching by electrical currents on multiple segments of a quantum cascade DFB/DBR/DR laser is a rapid (about one millisecond) process. A larger wavelength tuning range (nm) can be achieved by an array (a monolithic array is preferred) of multi-segment quantum cascade DFB/DBR/DR lasers. Furthermore, a quantum cascade DFB/DBR/DR laser can emit in terahertz wavelength (85 µm to 150 µm) range, where a metal has a high reflectivity. Thus a quantum cascade DFB/DBR/DR laser is ideal for a metal detection (security).

A compact bio-marker-on-a-chip to monitor/measure a disease parameter can be constructed by analyzing a change in reflectance and/or a Raman shift and/or surface electric current due to a disease-related bio-marker presence (with a specific antibody at about a picogram per mL concentration) on a surface of a 2-D/3-D photonic crystal of dielectric material. Confirmation of a bio-marker is not conclusive for an onset/presence of a disease. Identifications of many bio-markers are necessary to predict an onset/presence of a disease. However, a 2-D/3-D photonic crystal of dielectric material, incident with a multi-wavelength (blue, green and red) light source can be utilized for simultaneous identifications of many bio-markers of a disease. A multi-wavelength (blue, green and red) light source can be constructed as follows: optically pumps different-sized photonic crystals, whereas the photonic crystals can individually emit blue, green and red light based on their inherent sizes. An optical pump can be generated from an optical emission by an electrical activation of semiconductor quantum-wells. Blue, green and red light can be multiplexed/combined to generate a white light. A Raman shift, scattered by a bio-marker requires an expensive high-performance laser. However, a Raman sensor (requires an inexpensive CD-laser and a wavelength tunable filter) can monitor/measure a Raman shift due to a disease-related biomarker presence. A bio-marker molecule can induce a change in surface induced electric current when it binds to an atomically thin graphene surface (graphene's electronic sensitivity to biomolecular adsorption).

Furthermore, an array of graphene bio-sensors can detect many bio-markers of a disease-thus enabling a personalized ultra-compact diagnostic module, which can be connected/coupled/interacted with an intelligent subscriber subsystem 340 and an intelligent appliance 880.

A biological lab-on-a-chip (LOC) is a module that integrates a few bio-analytical functions on a single chip to perform a point-of-care disease diagnostics. A miniature biological lab-on-a-chip (LOC) module manufactured by Ostendum (www.ostendum.com) can be integrated (by inserting into an electro-mechanical cavity) with an intelligent appliance 880 to perform a point-of-care disease diagnostics reliably, quickly and economically. Such a lab result can be transmitted from an intelligent appliance 880 to a location based/assisted physician for an interpretation without a human input. Furthermore, powered by a nano-generator, Zinc Oxide nano-wire fabricated on Gallium Nitride/Indium Gallium Nitride/Aluminum Gallium Nitride can be a nano-light source (nano-LED) for a biological lab-on-a-chip.

Holographic images of a user's gene/protein can be stored in an intelligent appliance 880-thus a holographic image can enable a physician/surgeon to design a personalized medical and/or a surgical treatment.

Many software modules, as discussed above can consume a significant electrical power due to computational complexities. Alternatively, many software modules can be processed at a secure remote/cloud server. Software modules can be embedded within an intelligent subscriber subsystem 340 and/or an intelligent appliance 880, if an electrical power consumption and/or thermal management are feasible. An effective thermal management is critical to construct a high-performance intelligent appliance 880. Thermal resistance must be minimized at all material interfaces and materials with closely matching thermal expansion coefficients must be used.

Graphene can be viewed as a plane of carbon atoms extracted from a graphite crystal. Multiple-atomic layers of graphene are easier to fabricate than a single-atomic layer graphene and multiple-atomic layers of graphene retain thermal conductivity of a single-atomic layer graphene. Nano-scaled graphene heat pipe can be utilized to cool a hot spot within an intelligent appliance 880. For efficient thermal management, a heat sink/heat spreader of graphene/diamond/aluminum nitride/copper/aluminum/silicon/material with closely matching thermal expansion coefficients can be attached (e.g., to a processor module 760) by utilizing an interface heat transfer material (e.g., Indigo™ www.enerdynesolutions.com). However, a significant (about ten times) heat transfer of a heat sink/heat spreader can be gained by creating a nano-structured (e.g., Zinc Oxide nano-structures fabricated by micro-reactor assisted nano-material deposition process) surface on a heat sink/heat spreader. Furthermore, micro-channels can be fabricated by a laser machining method onto a heat sink/heat spreader for passive air and/or active (air/liquid/micro-scale ion cloud) cooling.

A micro-scale ion cloud can be generated as follows: on one side of graphene based micro-channels is a carbon nano-tube (CNT) negative electrode, when a negative voltage is switched on, electrons jump from a negative electrode toward a positive electrode, colliding with air molecules near a hot spot thus dissipating heat and producing a micro-scale cloud of positively charge ions. A micro-scale cloud of positively charge ions drifts towards a present negative electrode. However, before it reaches to present negative electrode, a voltage is switched on to another negative electrode at a different position. Forward and reverse wind of a micro-scale cloud of positively charge ions (created by changing the positions of negative electrodes) can cool a hot spot within an intelligent appliance 880. Alternatively, a high-efficiency nano-structured 50 A° thick $Sb_2Te_3$/10 A° thick $Bi_2Te_3$-based thin-film super-lattices thermoelectric cooler (TEC)/micro-refrigerator (1 mm×3 mm) can also be utilized to cool a hot spot within an intelligent appliance 880. However, significant thermoelectric cooler (TEC)/micro-refrigerator efficiency can be gained by fabricating a quantum wire/quantum dot, transitioning from a two-dimensional super-lattice.

Furthermore an intelligent appliance 880 can be charged via a resonant electro-magnetic inductive coupling energy transfer (within and/or to and/or from) without a physical wire.

The aluminum/magnesium alloys have small building blocks-called nano-crystal grains and crystal defects. Nano-crystal grains with crystal defects are mechanically stronger than perfect aluminum/magnesium crystals. An intelligent appliance 880's outer package can be constructed from a nano-engineered aluminum/magnesium alloy, a liquid Metal® alloy (www.liquidmetal.com), carbon-polymer composite (carbon fiber embedded with a molten polymer injection mold) and magnesium metal. Furthermore, an antenna can be constructed from a carbon fiber embedded with a metal/conducting polymer.

Figure 10:
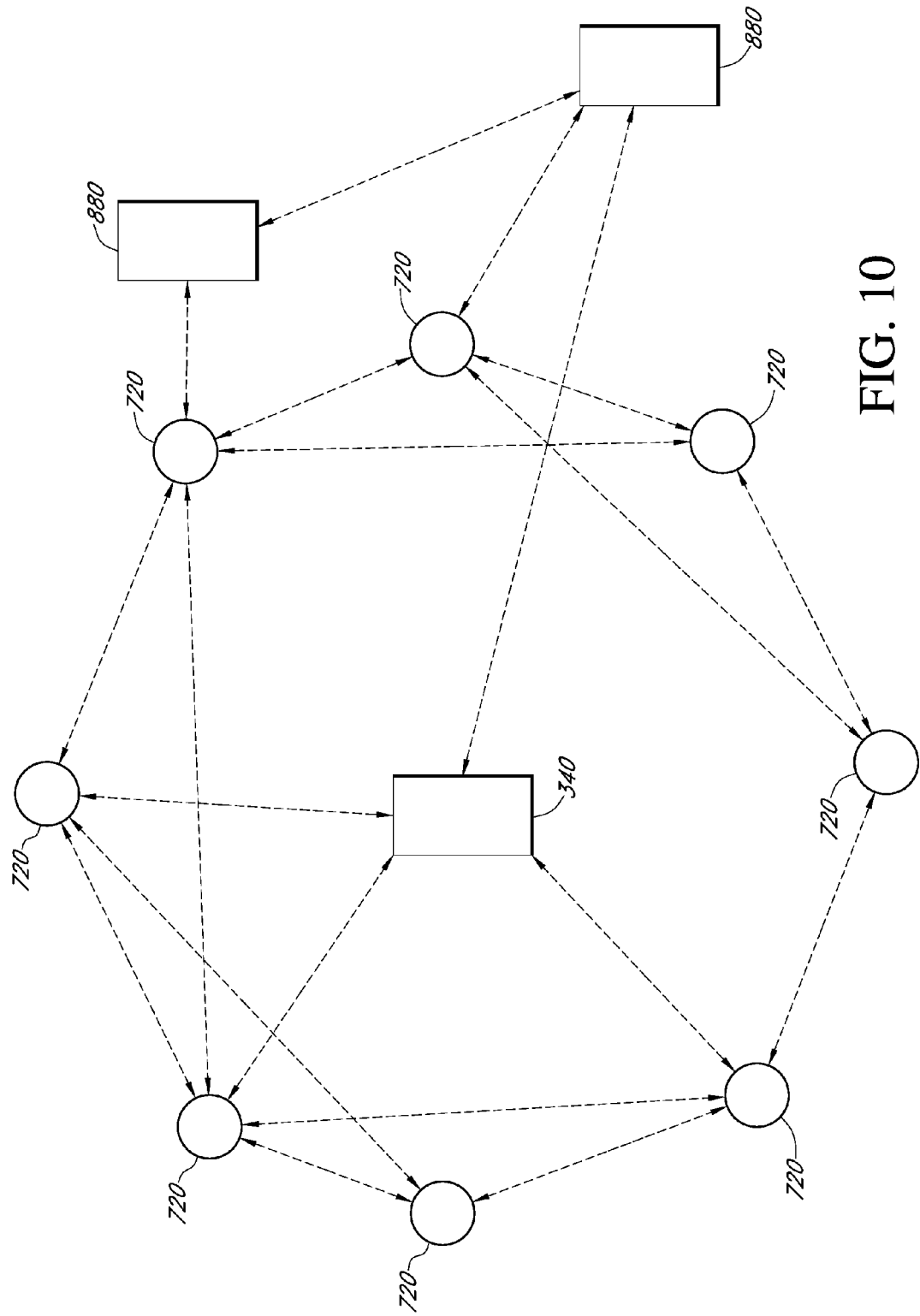
FIG. 10 illustrates a block diagram construction (configuration) of connections/couplings/interactions between an object 720 with another object 720, an intelligent subscriber subsystem 340 and an intelligent appliance 880, according to another embodiment of the present invention.

FIG. 10 illustrates a block diagram construction (configuration) of connections/couplings/interactions (via one or more or all electrical/optical/radio/sensor/bio-sensor communication network(s)) between an object(s) 720 with an intelligent subscriber subsystem(s) 340 and an intelligent appliance(s) 880, utilizing an Internet protocol version 6 (IPv6) and its subsequent versions. The context-awareness is (according to a user's situational context), personalized (tailored to a user's need), adaptive (change in response to a user' need) and anticipatory (can anticipate a user's desire).

An intelligent subscriber subsystem 340 and an intelligent appliance 880 are both context-ware (inferred from a user's past/present activities, extracted from a user's content/data and explicit in a user's profile) and sensor-aware (inferred from data/image/patterns from an object(s)).

Figure 11:
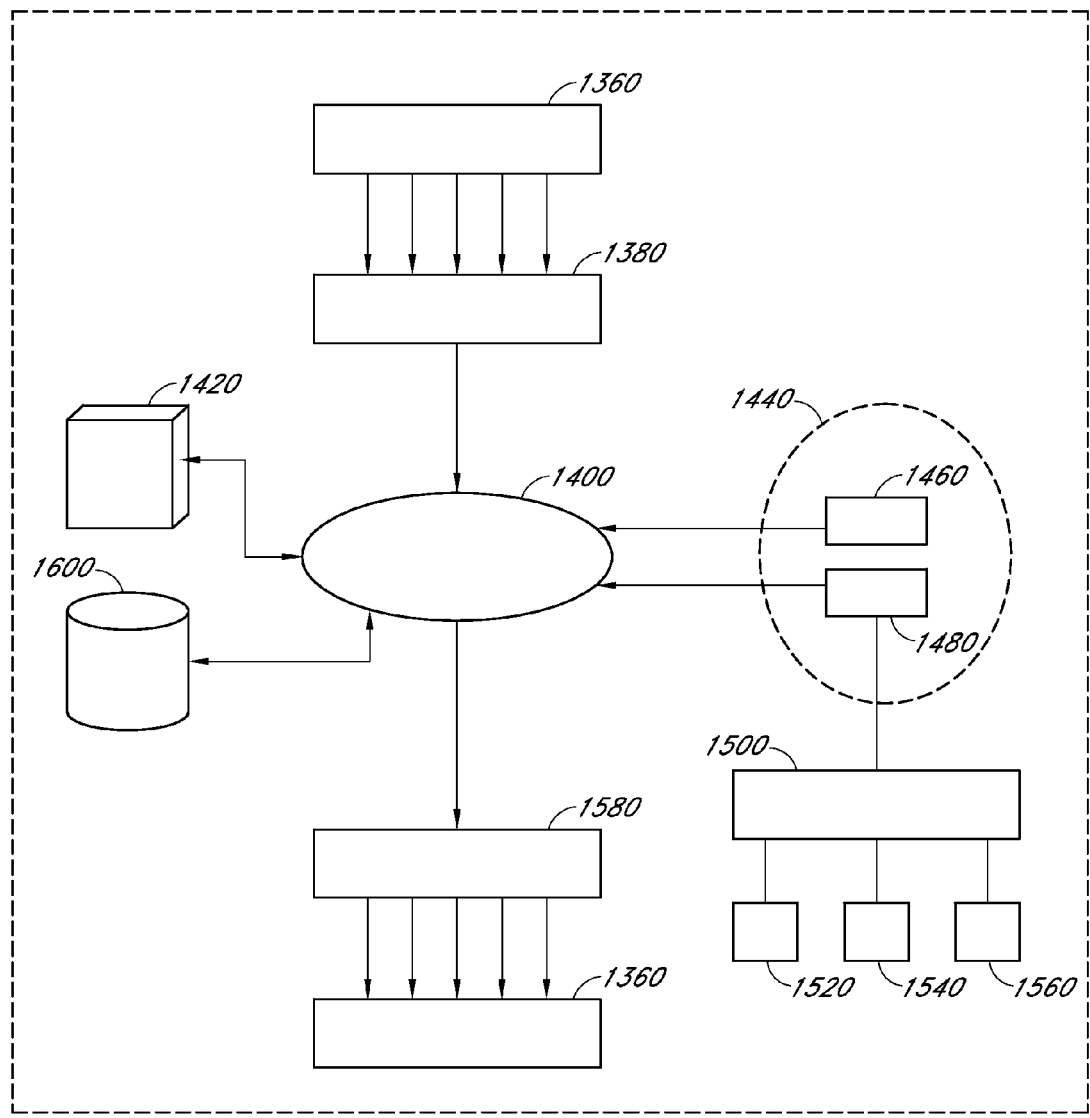
FIG. 11 illustrates a block diagram method flow-chart (configuration) enabling a task execution by a software agent, according to another embodiment of the present invention.

FIG. 11 illustrates a block diagram method flow-chart (configuration) enabling a task execution by a software agent. An incoming task is communicated from a communication channel 1360, to an incoming queuing element 1380, to an execution manager 1400. An execution manager 1400 gains information from (and also shares with) a transient knowledge element 1420 and a data base element 1600. An execution manager 1400 further gains information from a permanent knowledge element 1440, which comprises an attribute element 1460 and a capability element 1480. A capability element 1480 is connected to a task element 1500, which is further connected to a rule element 1520, a method element 1540 and a knowledge source element 1560. Executed/processed task from an execution manager 1400, is communicated to an outgoing queuing task controller 1580 to a communication channel 1360.

The above description is provided to illustrate only preferred embodiments of the present invention, however it is not intended to be limiting. Numerous variations and modifications within the scope of the present invention are possible.

I claim:

1. An optical system, comprising:
   (a) a node configured with a remote node comprising: at least one single-mode optical fiber;
   (b) the node configured with the remote node comprising: at least one optical subsystem, wherein the optical subsystem is selected from the group consisting of: a wavelength division multiplexer, a wavelength division demultiplexer and a cyclic arrayed waveguide grating router;
   (c) the node further comprising: a first optical subsystem and a second optical subsystem,
   wherein the first optical subsystem is configured for transmission of more than one gigabit per second of optical signals, wherein the optical signals are selected from one or more wavelengths of a first set of wavelengths, wherein the second optical subsystem is configured for reception of at least one gigabit per second of optical signals, wherein the optical signals are selected from one or more wavelengths of a second set of wavelengths, which are offsets in wavelengths with respect to the first set of wavelengths;
   (d) the remote node comprising: a subscriber optical subsystem,
   wherein the subscriber optical subsystem is configured for reception of more than one gigabit per second of optical signals, wherein the optical signals are selected from one or more wavelengths of the first set of wavelengths,
   wherein the subscriber optical subsystem is further configured for transmission of at least one gigabit per second of optical signals, wherein the optical signals are selected from one or more wavelengths of the second set of wavelengths, which are offset in wavelengths with respect to the first set of wavelengths,
   wherein the transmission of optical signals is configured by an optical micro-subsystem in a looped arrangement at the subscriber optical subsystem, wherein the optical micro-subsystem is configured for phase modulation, intensity modulation and amplification of optical signals.

2. The optical system according to claim 1, wherein the optical system further comprises a local node.

3. The optical system according to claim 1, wherein the node further comprises a local node.

4. The optical system according to claim 1, wherein the optical system further comprises a transmission protocol, wherein the transmission protocol is selected from the group consisting of: a time division multiplexing and a broadcast.

5. The optical system according to claim 1, wherein the optical system further comprises a reception protocol, wherein the reception protocol is selected from the group consisting of: a time division multiplexing and a broadcast.

6. The optical system according to claim 1, wherein the optical system further comprises an electronic circuit module, wherein the electronic circuit module is selected from the group consisting of: a pilot-tone modulation circuit, a burst-mode circuit, a forward-error correction circuit and an electronic dispersion compensation circuit.

7. The optical system according to claim 1, wherein the optical system further comprises an optical module, wherein the optical module is selected from the group consisting of: a laser, a photodiode, a modulator, a demodulator, a phase-to-intensity converter, an optical amplifier, an optical power combiner, an optical power decombiner, a wavelength combiner, a wavelength decombiner, an arrayed waveguide grating router, a cyclic arrayed waveguide grating router, a space switch, an optical switch, an optical circulator, an optical filter, an optical intensity attenuator and a dispersion-compensated single-mode optical fiber.

8. The optical system according to claim 1, wherein the subscriber optical subsystem further comprises an optical amplifier module and an optical module, wherein the optical module is selected from the group consisting of: a laser, a phase modulator, an intensity modulator and an optical intensity attenuator.

9. The optical system according to claim 1, wherein the subscriber optical subsystem further comprises a photodiode module, an optical circulator and an optical filter.

10. The optical system according to claim 1, wherein the subscriber optical subsystem further comprises an internet address, an internet firewall, a spyware and an algorithm, wherein the algorithm is selected from the group consisting of:
 a user specified safety control algorithm, an in situ in situ diagnostics algorithm, a remote diagnostics algorithm and an authentication algorithm.

11. The optical system according to claim 1, wherein the subscriber optical subsystem further comprises a connection module, wherein the connection module is selected from the group consisting of: an electrical wire, a radio module, an electro-magnetic induction module and a sensor module.

12. The optical system according to claim 11, wherein the radio module is selected from the group consisting of: an ultra-wideband module, a millimeter wave module, a software-defined radio module and a position module.

13. The optical system according to claim 12, wherein the position module is selected from the group consisting of: a Bluetooth module, a Wi-Fi module, a GPS module and an electronic compass module.

14. The optical system according to claim 1, wherein the subscriber optical subsystem further comprises an electronic module, wherein the electronic module is selected from the group consisting of: a voice processing module, a video compression module, a content over-IP module, a video conference over-IP module, a 3D video conference over-IP module, a voice-to-text module and a text-to-voice module.

15. The optical system according to claim 1, wherein the subscriber optical subsystem further comprises an algorithm, wherein the algorithm is selected from the group consisting of: a voice processing algorithm, a video compression algorithm, a content over-IP algorithm, a video conference over-IP algorithm, a 3D video conference over-IP algorithm, a voice-to-text algorithm and a text-to-voice algorithm.

16. The optical system according to claim 1, wherein the subscriber optical subsystem further comprises an electronic module, wherein the electronic module is selected from the group consisting of: a set top box, an internet connected set top box, a personal video recorder, an internet connected personal video recorder, a personal server, an internet connected personal server, a time-shift module, an internet connected time-shift module, a place-shift module and an internet connected place-shift module.

17. The optical system according to claim 1, wherein the subscriber optical subsystem further comprises an intelligence rendering algorithm.

18. The optical system according to claim 1, wherein the subscriber optical subsystem further comprises an algorithm with a software agent.

19. The optical system according to claim 1, wherein the subscriber optical system is further configured for context-awareness.

20. The optical system according to claim 1, wherein the subscriber optical subsystem is further configured for sensor-awareness.

21. The optical system according to claim 1, wherein the subscriber optical subsystem is further configured with a connection module, wherein the connection module is selected from the group consisting of: an electrical wire, a radio module, an electro-magnetic induction module, a sensor module and a bio-sensor module for a coupling with an object, wherein the object comprises a power source module and wherein the object further comprises a module selected from the group consisting of: a sensor module, a bio-sensor module and a radio module.

22. The optical system according to claim 1, wherein the subscriber optical subsystem is further configured with a connection module, wherein the connection module is selected from the group consisting of: an electrical wire, a radio module, an electro-magnetic induction module, a sensor module and a bio-sensor module for a coupling with an appliance, wherein the appliance comprises an IP address, an operating system algorithm, a processor module, a memory module, a display module, a microphone module, a camera module, a radio module and a power source module.

23. The optical system according to claim 1, wherein the subscriber optical subsystem is further configured with connection module, wherein the connection module is selected from the group consisting of: an electrical wire, a radio module, an electro-magnetic induction module, a sensor module and a bio-sensor module for a coupling to an appliance, wherein the appliance comprises an IP address, an operating system algorithm, an intelligence rendering algorithm, a processor module, a memory module, a display module, a microphone module, a camera module, a radio module and a power source module.

24. The optical system according to claim 1, wherein the subscriber optical subsystem is further configured with connection module, wherein the connection module is selected from the group consisting of: an electrical wire, a radio module, an electro-magnetic induction module, a sensor module and a bio-sensor module for a coupling to an appliance, wherein the appliance comprises IP address, an operating system algorithm, an intelligence rendering algorithm, an algorithm with a software agent, a processor module, a memory module, a display module, a microphone module, a camera module, a radio module and a power source module.

25. An optical system, comprising:
(a) a node configured with a remote node comprising: at least one single-mode optical fiber;
(b) the node configured with the remote node comprising: at least one optical subsystem, wherein the optical subsystem is selected from the group consisting of: a wavelength division multiplexer, a wavelength division demultiplexer and a cyclic arrayed waveguide grating router;
(c) the node further comprising: a first optical subsystem and a second optical subsystem,
wherein the first optical subsystem is configured for at least one function, selected from the group consisting of: transmission of wavelength on-Demand, transmission of bandwidth on-Demand and transmission of service on-Demand, selected from one or more wavelengths of a first set of wavelengths,
wherein the transmission of wavelength on-Demand is further configured by at least one function, selected from the group consisting of: wavelength tuning, phase modulation and intensity modulation of optical signals,
wherein the transmission of bandwidth on-Demand is further configured by at least one function, selected from the group consisting of: wavelength tuning, phase modulation and intensity modulation of optical signals, wherein the transmission of service on-Demand is further configured by at least one function, selected from the group consisting of: wavelength tuning, phase modulation and intensity modulation of optical signals, and wherein the second optical subsystem is configured for reception of bandwidth, selected from one or more wavelengths of a second set of wavelengths, which are offsets in wavelengths with respect to the first set of wavelengths;

(d) the remote node comprising: a subscriber optical subsystem, wherein the subscriber optical subsystem is configured for at least one function, selected from the group consisting of: reception of wavelength on-Demand, reception of bandwidth on-Demand and reception of service on-Demand, selected from one or more wavelengths of the first set of wavelengths, wherein the subscriber optical subsystem is further configured for transmission of bandwidth, selected from one or more wavelengths of a second set of wavelengths, which are offsets in wavelengths with respect to the first set of wavelengths, wherein the subscriber optical subsystem is further configured for transmission of optical signals, selected from one or more wavelengths of the second set of wavelengths, which are offsets in wavelengths with respect to the first set of wavelengths, wherein the transmission of optical signals is configured by an optical micro-subsystem in a looped arrangement at the subscriber optical subsystem, wherein the optical micro-subsystem is configured for phase modulation, intensity modulation and amplification of optical signals.

* * * * *